(12) United States Patent
Kim et al.

(10) Patent No.: US 11,544,157 B2
(45) Date of Patent: Jan. 3, 2023

(54) APPARATUS AND METHOD FOR STORING DATA IN AN MLC AREA OF A MEMORY SYSTEM

(71) Applicant: SK hynix Inc., Gyeonggi-do (KR)

(72) Inventors: Young-Ho Kim, Gyeonggi-do (KR); Ik-Joon Son, Gyeonggi-do (KR); Eun-Mo Yang, Gyeonggi-do (KR); Gyu-Yeul Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 505 days.

(21) Appl. No.: 16/721,260

(22) Filed: Dec. 19, 2019

(65) Prior Publication Data

US 2020/0409805 A1 Dec. 31, 2020

(30) Foreign Application Priority Data

Jun. 28, 2019 (KR) ........................ 10-2019-0077701

(51) Int. Cl.
*G06F 11/14* (2006.01)
*G06F 11/00* (2006.01)
*G11C 16/00* (2006.01)
*G06F 1/30* (2006.01)
*G11C 16/10* (2006.01)
*G11C 16/34* (2006.01)
*G11C 29/00* (2006.01)
*G11C 29/52* (2006.01)

(52) U.S. Cl.
CPC ............ *G06F 11/1471* (2013.01); *G06F 1/30* (2013.01); *G06F 11/141* (2013.01); *G06F 11/1448* (2013.01); *G11C 16/105* (2013.01); *G11C 16/3418* (2013.01); *G11C 29/52* (2013.01); *G11C 29/74* (2013.01)

(58) Field of Classification Search
CPC ...... G06F 11/1471; G06F 1/30; G06F 11/141; G06F 11/1448; G11C 16/105; G11C 16/3418; G11C 29/52; G11C 29/74
See application file for complete search history.

(56) References Cited

U.S. PATENT DOCUMENTS 8,923,045 B2 12/2014 Goss et al.
9,530,491 B1 12/2016 Uttarwar et al.
(Continued)

FOREIGN PATENT DOCUMENTS

KR 10-1257848 4/2013

*Primary Examiner* — Justin R Knapp
(74) *Attorney, Agent, or Firm* — IP & T Group LLP

(57) ABSTRACT

A memory system may include: a nonvolatile memory device comprising a plurality of memory blocks, each block having a plurality of pages, each page having a plurality of memory cells, wherein the plurality of memory block includes an SLC (Single Level Cell) block and an MLC (Multi-Level Cell) block; and a controller suitable for programming input data transmitted from a host to both the SLC block and the MLC block in response to a first program command, and invalidating the input data programmed in the SLC block at a time point when the program operation for the MLC block is completed, when the memory system is powered on after an SPO (Sudden Power-Off) occurred while the program operation was performed on both the SLC block and the MLC block, the controller may perform a recovery operation to the MLC block based on valid data programmed in the SLC block.

20 Claims, 11 Drawing Sheets

(56) References Cited

U.S. PATENT DOCUMENTS

2020/0393994 A1* 12/2020 Subbarao ................ G06F 3/061
2020/0395087 A1* 12/2020 Banerjee ................ G11C 16/14
2020/0402605 A1* 12/2020 Subbarao ........... H03M 13/1105
2021/0011818 A1*  1/2021 Kim .................... G06F 11/1441

* cited by examiner

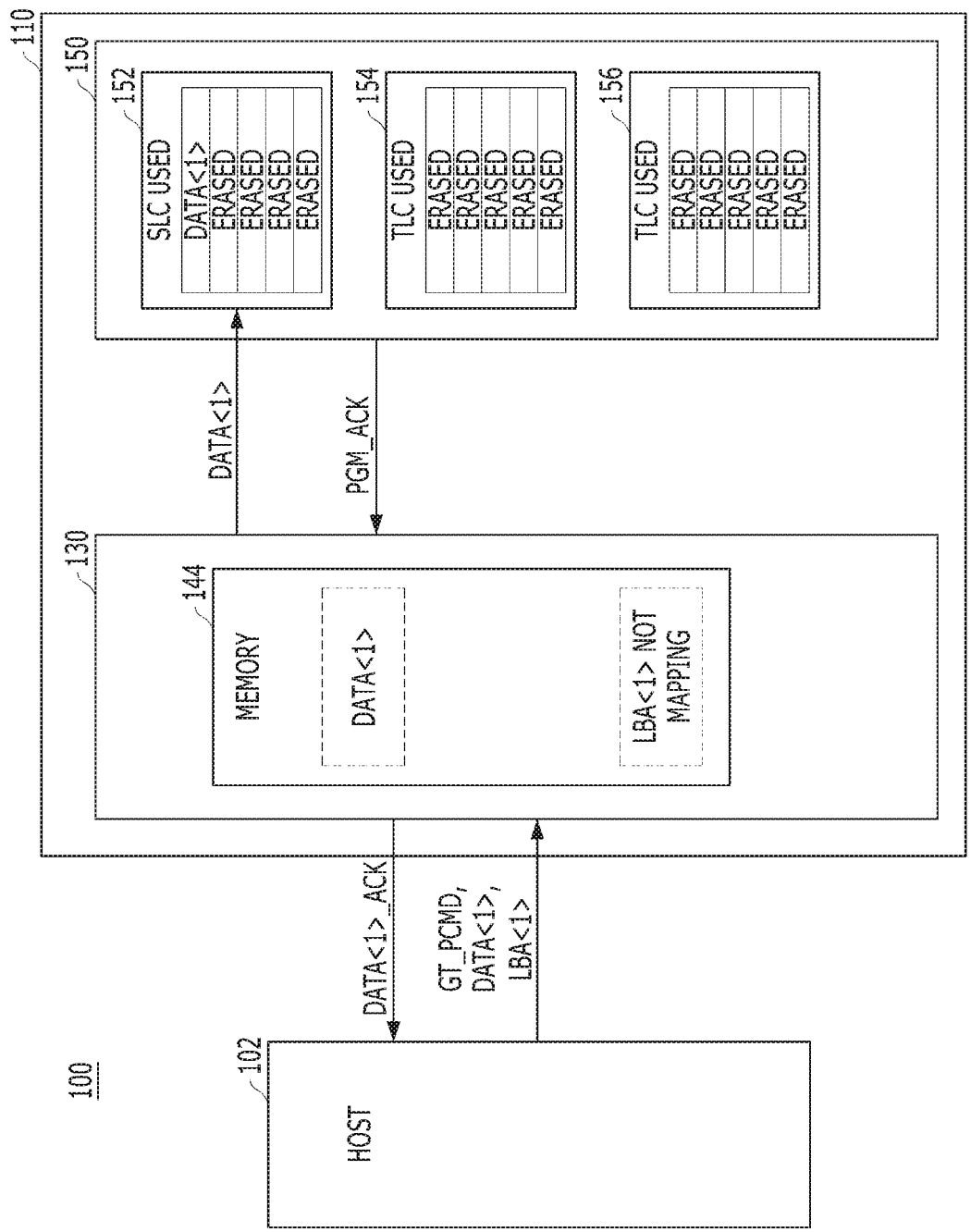

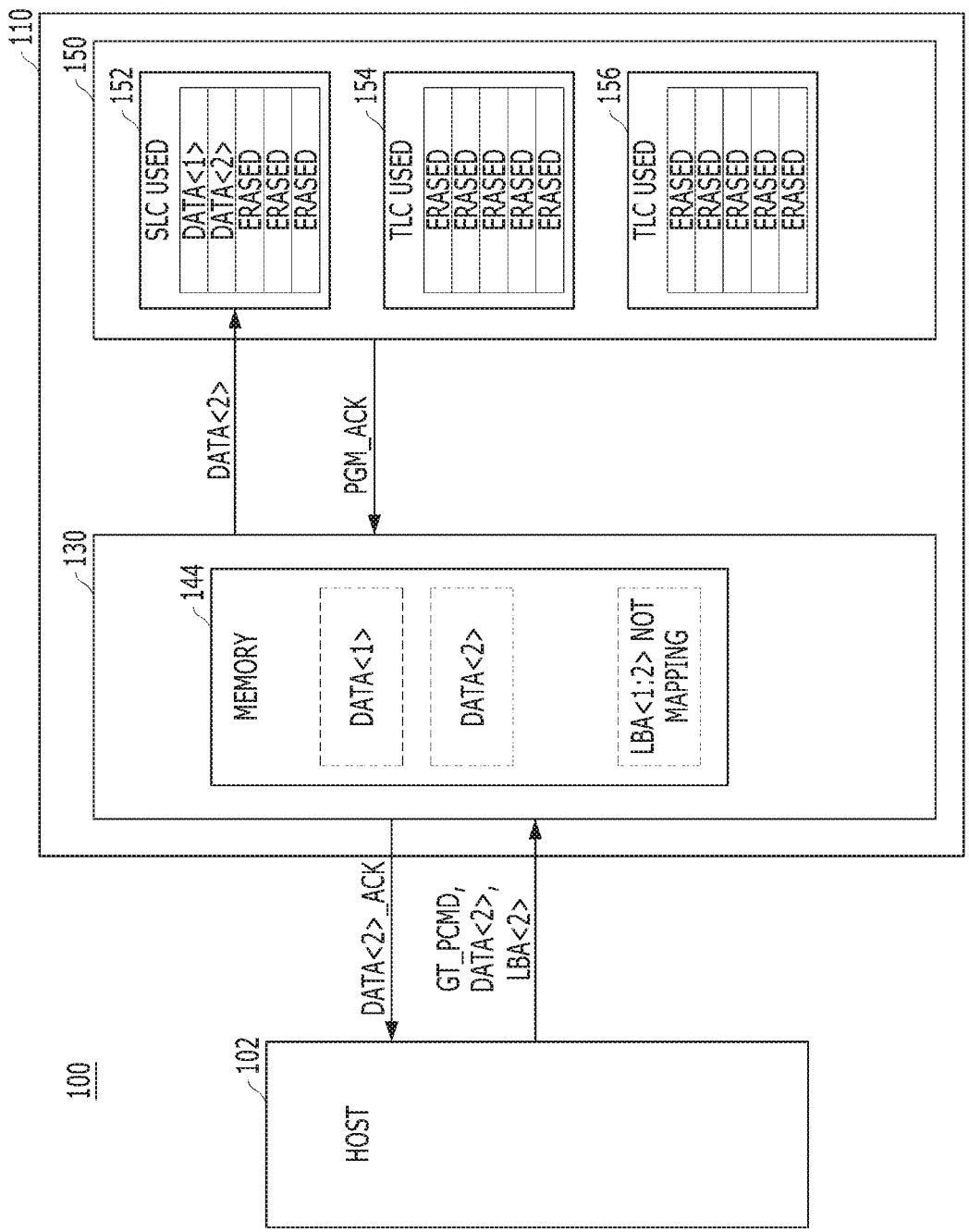

APPARATUS AND METHOD FOR STORING DATA IN AN MLC AREA OF A MEMORY SYSTEM

CROSS-REFERENCE TO RELATED APPLICATION

This application claims priority under 35 U.S.C. § 119 to Korean Patent Application No. 10-2019-0077701 filed on Jun. 28, 2019, which is incorporated herein by reference in its entirety.

BACKGROUND

1. Field

Exemplary embodiments relate to a memory system, and more particularly, to a memory system for storing input data in an internal multi-level cell (MLC) area, and an operating method thereof.

2. Discussion of the Related Art

Recently, a paradigm for a computing environment has shifted to ubiquitous computing, which enables computer systems to be accessed virtually anytime and everywhere. As a result, the use of portable electronic devices, such as mobile phones, digital cameras, notebook computers, and the like, are increasing. Such portable electronic devices typically use or include a memory system that embeds at least one memory device, i.e., a data storage device. The data storage device can be used as a main storage device or an auxiliary storage device of a portable electronic device.

Unlike a hard disk, a data storage device using a nonvolatile semiconductor memory device is advantageous in that it has excellent stability and durability because it has no mechanical driving parts (e.g., a mechanical arm), has a high data access speed, and has low power consumption. An example of a memory system having such advantages includes a USB (Universal Serial Bus) memory device, a memory card having various interfaces, a solid state drive (SSD), or the like.

SUMMARY

Various embodiments are directed to a memory system which can use a single level cell (SLC) area as a backup area in order to safely store data inputted from a host or computing device to a multi-level cell (MLC) area within the memory system, and an operating method thereof.

Also, various embodiments are directed to a memory system which can program data inputted from a host or a computing device to the MLC area within the memory system and backup the same data to an SLC area of which a speed of program operation is faster than that of an MLC area, and an operating method thereof.

Also, various embodiments are directed to a memory system which can program data to an SLC area and an MLC area in a memory device individually when a controller has to assure that the data is stored in the memory device (e.g., data atomicity). Furthermore, when the data is completely programmed to any one of the SLC area and the MLC area, the controller can transmit a response to a host interworking with the memory system, the response assuring that the corresponding data will be programmed safely inside the memory system.

Also, an embodiment is directed to a memory system which can associate a logical address inputted along with data from a host or computing device with a physical address of an MLC area only without associating the logical address with a physical address of an SLC area, invalidate backup data programmed in the SLC area at a point of time that the same data is completely programmed in the MLC area, and recover the data of the MLC area using valid data read from the SLC area after the memory system is powered on again, when a sudden power off (SPO) occurs in the memory system so that the data may not be completely programmed in the MLC area, and an operating method thereof.

Also, an embodiment is directed to an apparatus and method which can use an SLC area within a memory device as an area for temporarily storing data to be stored in an MLC area, and not only store only data in the SLC area but also store information related to the data in the SLC area for example, a data order or a data sequence, program time information, and position information of the MLC area. When an issue such as a sudden power off occurs in the memory system such that it is difficult to assure completeness regarding an operation, the memory system may store relevant data and information in the SLC area. Then, when the memory system is powered on, a recovery operation may be performed based on the data and information stored in the SLC area.

Technical objects of the present disclosure are not limited to the above-described technical objects, and other technical objects which are not described herein will be dearly understood by those skilled in the art to which the present disclosure pertains, based on the following descriptions.

In an embodiment, a memory system may include: a nonvolatile memory device comprising a plurality of memory blocks, each block having a plurality of pages, each page having a plurality of memory cells, wherein the plurality of memory block includes an SLC (Single Level Cell) block and an MLC (Multi-Level Cell) block; and a controller suitable for programming input data transmitted from a host to both the SLC block and the MLC block in response to a first program command, and invalidating the input data programmed in the SLC block at a time point when the program operation for the MLC block is completed, when the memory system is powered on after an SPO (Sudden Power-Off) occurred while the program operation was performed on both the SLC block and the MLC block, the controller may perform a recovery operation to the MLC block based on valid data programmed in the SLC block.

The controller may do not map a logical address received with the input data from the host to a physical address of a page where the input data is programmed in the SLC block, but may map the logical address to only a physical address of a page where the input data is programmed in the MLC block.

When programming the input data to the SLC block, the controller may further program position information of the page, where the input data is programmed or scheduled to be programmed in the MLC block corresponding to the program operation, to a spare area of the page where the program operation is performed.

When the memory system is powered on again after an SPO occurred while the program operation was performed on each of the SLC block and MLC block, the controller may retrieve a programmed page or erased page from the MLC block corresponding to the program operation by referring to position information stored in a spare area of a valid page retrieved from the SLC block, may perform a recovery checking operation of checking the state of the programmed page or erased page retrieved from the MLC block, and then may selectively perform a recovery operation on the MLC block from the SLC block according to the performance result of the recovery checking operation.

When a first programmed page corresponding to the program operation is retrieved from the MLC block by referring to position information stored in a spare area of a first valid page retrieved from the SLC block during the recovery checking operation, the controller may check whether data stored in the first programmed page can be normally read, and may invalidate the first valid page without performing the recovery operation on the first programmed page, when the check result indicates that the data can be normally read.

When the check result indicates that the data cannot be normally read, the controller may perform a recovery operation on the first programmed page using the data stored in the first valid page, and may invalidate the first valid page after completing the recovery operation.

When a first erased page corresponding to the program operation is retrieved from the MLC block by referring to position information stored in a spare area of a second valid page retrieved from the SLC block during the recovery checking operation, the controller may perform a recovery operation on the first erased page through data stored in the second valid page, and may invalidate the second valid page after completing the recovery operation.

The position information stored in the spare area of the page to which the input data is programmed when the controller programs the input data to the SLC block may include the physical address of the page where the input data is programmed or scheduled to be programmed in the MLC block corresponding to the program operation or information corresponding to the order or time point that the input data is programmed or scheduled to be programmed in the MLC block corresponding to the program operation.

The controller may control the memory device not to program input data received from the host to the SLC block, but to program the input data only to the MLC block, in response to a second program command.

In an embodiment, An operating method of a memory system which includes a plurality of memory blocks, each block including a plurality of pages, each page including a plurality of memory cells, wherein the plurality of memory block includes an SLC block and an MLC block, the operating method may include: programming input data transmitted from a host to both the SLC block and the MLC block in response to a first program command; invalidating the input data programmed in the SLC block at a time point when the program operation for the MLC block is completed; and performing a recovery operation to the MLC block based on valid data of the SLC block, when the memory system is powered on after an SPO (Sudden Power-Off) occurs in the programming of the input data.

The operating method may further include not mapping a logical address received with the input data from the host to a physical address of a page where the input data is programmed in the SLC block, but mapping the logical address to only a physical address of a page where the input data is programmed in the MLC block.

The programming of the input data may include: programming the input data to a normal area of a first page of the SLC block; and programming position information of the page, where the input data is programmed or scheduled to be programmed in the MLC block corresponding to the program operation, to a spare area of the first page.

The performing of the recovery operation may include: retrieving a programmed page or erased page from the MLC block corresponding to the program operation by referring to position information stored in a spare area of a valid page retrieved from the SLC block, and checking the state of the programmed page or erased page retrieved from the MLC block, when the memory system is powered on after an SPO occurs in the programming of the input data; and selectively performing a recovery operation on the MLC block from the SLC block according to the result of the checking of the state of the programmed page or erased page.

The selectively performing of the recovery operation may include: a first check step of checking whether data stored in a first programmed page corresponding to the program operation can be normally read, when the first programmed page is retrieved from the MLC block by referring to position information stored in a spare area of a first valid page retrieved from the SLC block in the checking of the state of the programmed page or erased page; and an invalidation step of invalidating the first valid page without performing a recovery operation on the first programmed page, when the result of the first check step indicates that the data can be normally read.

The selectively performing of the recovery operation further may include performing a recovery operation on the first programmed page using the data stored in the first valid page, and invalidating the first valid page after completing the recovery operation, when the result of the first check step indicates that the data cannot be normally read.

The selectively performing of the recovery operation may further include performing a recovery operation on the first erased page through data stored in a second valid page retrieved from the SLC block in the checking of the state of the programmed page or erased page, and invalidating the second valid page after completing the recovery operation, when a first erased page corresponding to the program operation is retrieved from the MLC block by referring to position information stored in a spare area of the second valid page.

The position information stored in the spare area of the first page may include the physical address of the page where the input data is programmed or scheduled to be programmed in the MLC block corresponding to the program operation or information corresponding to the order or time point that the input data is programmed or scheduled to be programmed in the MLC block corresponding to the program operation.

The operating method may further include not programming input data received from the host to the SLC block, but programming the input data only to the MLC block, in response to a second program command.

In an embodiment, a memory system may include: a nonvolatile memory device comprising a plurality of memory blocks, each block having a plurality of memory cells, wherein the plurality of memory block includes an SLC block and an MLC block; and a controller suitable for instructing the memory device to program first data, whose atomicity satisfies a preset level, to both the SLC block and the MLC block through program operations, the atomicity indicating that the first data would be programmed to the memory device, the controller may output, to the outside, a signal indicating that the program operation for the first data is completed, when one of the program operations regarding the first data, which are individually performed in both the SLC block and the MLC block, is completed, may invalidate the first data programmed in the SLC block when the program operation performed in the MLC block is completed, and may perform a recovery operation to the MLC block using the valid first data in the SLC block, when the memory system is powered on after an SPO occurred while the program operations ere individually performed on both the SLC block and the MLC block.

The controller may instruct only the MLC block to perform a program operation on second data whose atomicity does not satisfy the preset level, among the data inputted from the outside, the atomicity indicating that the second data is to be programmed to the memory device.

In an embodiment, a memory system may include: a memory device including a plurality of nonvolatile memory blocks, wherein the plurality of nonvolatile memory blocks includes an SLC (Single Level Cell) block and an MLC (Multi-Level Cell) block; a controller configured to store a piece of program data in both the SLC block and the MLC block based on atomicity regarding the piece of program data, the controller may attempt a recovery operation to the MLC block based on the piece of program data stored in the SLC block when it has been failed to store the piece of program data in the MLC block.

BRIEF DESCRIPTION OF THE DRAWINGS

FIG. 3A is a diagram describing a first process of the first program operation which is performed in the memory system in accordance with the embodiment.

FIG. 3B is a diagram describing a second process of the first program operation which is performed in the memory system in accordance with the embodiment.

DETAILED DESCRIPTION

Figure 1A:
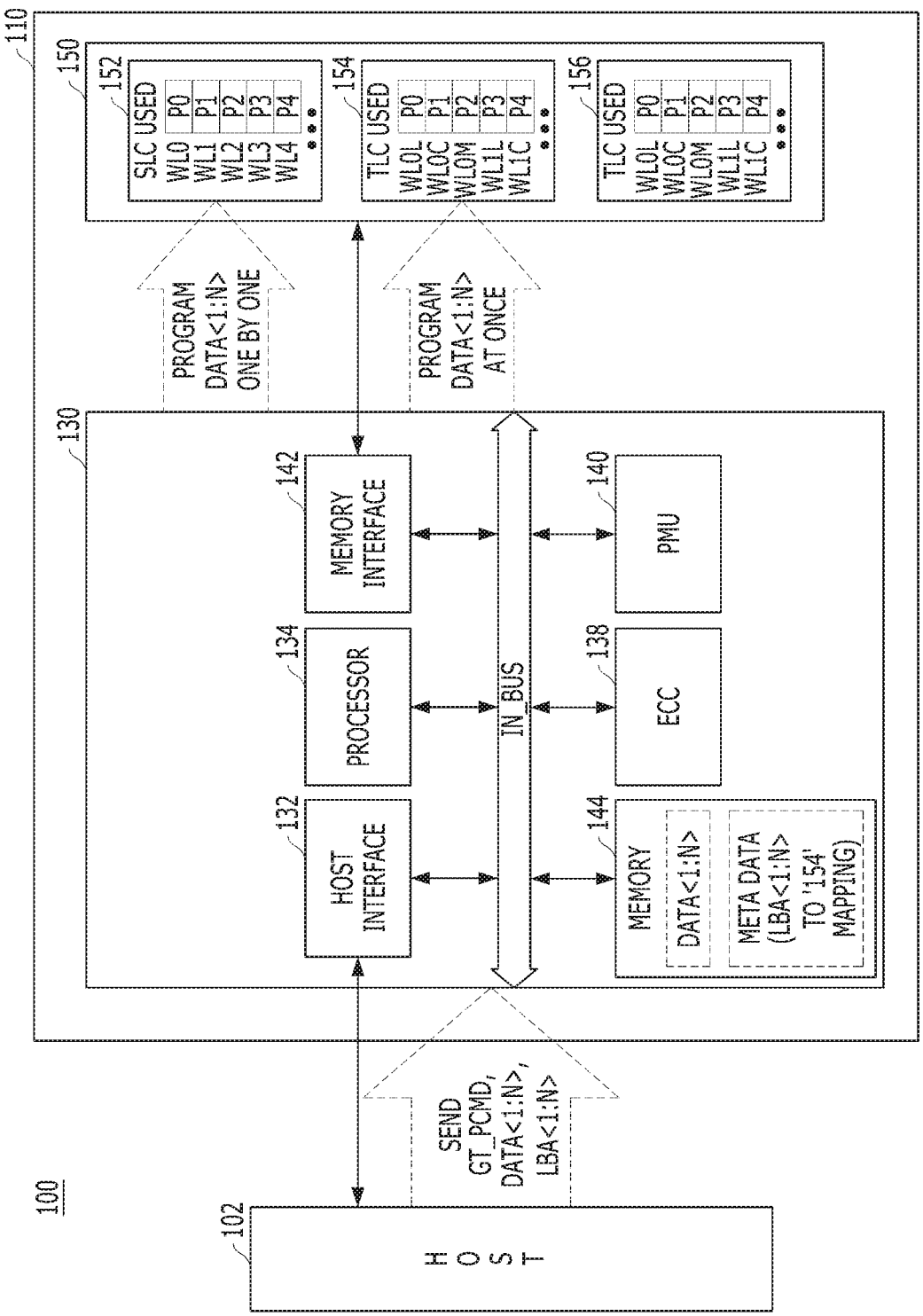
FIG. 1A is a diagram describing a first program operation which is performed in a memory system in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1A is a diagram describing a first program operation which is performed in a memory system in accordance with an embodiment.

Figure 1B:
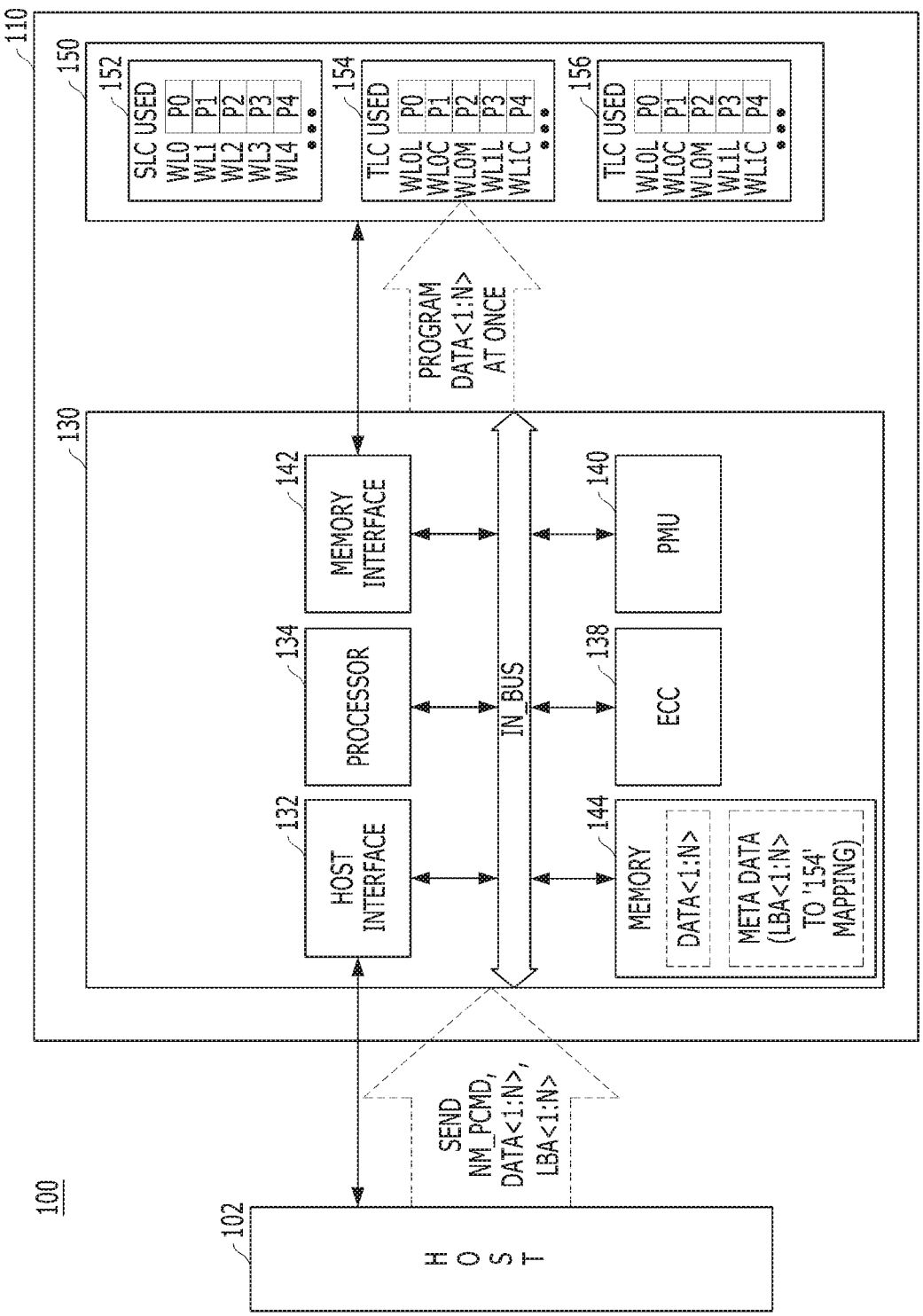
FIG. 1B is a diagram describing a second program operation which is performed in the memory system in accordance with an embodiment.

FIG. 1B is a diagram describing a second program operation which is performed in the memory system in accordance with an embodiment.

Referring to FIGS. 1A and 1B, a data processing system 100 in accordance with an embodiment of the present disclosure is described. Referring to FIGS. 1A and 1B, the data processing system 100 may include a host 102 engaged or operating with a memory system 110.

The host 102 may include, for example, a portable electronic device such as a mobile phone, an MP3 player and a laptop computer, or a non-portable electronic device such as a desktop computer, a game player, a television (TV), a projector, and the like.

The host 102 also includes at least one operating system (OS), which can generally manage and control, functions and operations performed in the host 102. The OS can provide interoperability between the host 102 engaged with the memory system 110 and a user using the memory system 110. The OS may support functions and operations corresponding to a user's requests. By way of example but not limitation, the OS can be classified into a general operating system and a mobile operating system according to mobility of the host 102. The general operating system may be split into a personal operating system and an enterprise operating system according to system requirements or a user's environment. The personal operating system, including Windows and Chrome, may be subject to support services for general purposes. But the enterprise operating systems can be specialized for securing and supporting high performance, including Windows servers, Linux, Unix, and the like. Further, the mobile operating system may include Android, iOS, Windows mobile, and the like. The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to commands within the memory system 110.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any of various types of storage devices, which may be electrically coupled with the host 102, according to a protocol of a host interface. Non-limiting examples of suitable storage devices include a solid state drive (SSD), a multi-media card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, for example, a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM), and a flash memory.

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which may be included in any of the various types of memory systems as discussed above in the examples.

By way of example but not limitation, the controller 130 and the memory device 150 may be integrated into a single semiconductor device. The controller 130 and memory device 150 may be integrated into an SSD for improving an operation speed. When the memory system 110 is used as an SSD, the operating speed of the host 102 connected to the memory system 110 can be improved more than that of the host 102 implemented with a hard disk. In addition, the controller 130 and the memory device 150 may be integrated into one semiconductor device to form a memory card, such as a PC card (PCMCIA), a compact flash card (CF), a memory card such as a smart media card (SM, SMC), a memory stick, a multimedia card (MMC, RS-MMC, MMC-micro), a SD card (SD, miniSD, microSD, SDHC), a universal flash memory, or the like.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even when electrical power is not supplied. The memory device 150 may store data provided from the host 102 through a write operation, and provide data stored therein to the host 102 through a read operation. The memory device 150 may include a plurality of memory blocks 152, 154, 156, each of which may include a plurality of pages P0, P1, P2, P3, P4. Each of the plurality of pages may include a plurality of memory cells to which a plurality of word lines WL0, WL1, WL2, WL3, WL4 are electrically coupled. The memory device 150 also includes a plurality of memory dies, each of which includes a plurality of planes, each of which includes a plurality of memory blocks 152, 154, 156. In addition, the memory device 150 may be a non-volatile memory device, for example a flash memory, wherein the flash memory may be embodied in a three-dimensional stack structure.

The controller 130 may sort a plurality of memory blocks 152, 154 and 156 included in the memory device 150 into single level cell (SLC) memory blocks and multi-level cell (MLC) memory blocks, depending on the number of bits which can be stored or expressed in one memory cell. The SLC memory block may include a plurality of pages implemented by memory cells each capable of storing one-bit data therein, and has excellent data computing performance and high durability. At this time, when each of the memory cells included in the SLC memory block is referred to as storing one-bit data therein, it may indicate that data of one page can be stored in memory cells coupled via a single word line of a plurality of word lines WL0, WL1, WL2, WL3, WL4, . . . included in the SLC memory block. The MLC memory block may include a plurality of pages implemented by memory cells each capable of storing multi-bit data therein (for example, two or more-bit data), and have a larger data storage space than the SLC memory block. In other words, the MLC memory block may be highly integrated. In particular, the controller 130 may sort the MLC memory block into a triple level cell (TLC) memory block including a plurality of pages implemented by memory cells each capable of storing three-bit data therein, a quadruple level cell (QLC) memory block including a plurality of pages implemented by memory cells each capable of storing four-bit data therein, or a multiple level cell memory block including a plurality of pages implemented by memory cells each capable of storing five or more-bit data therein, as well as the MLC memory block including a plurality of pages implemented by memory cells each capable of storing two-bit data therein. At this time, when each of the memory cells included in the MLC memory block is referred to as storing two-bit data, it may indicate that data of two pages can be stored in memory cells coupled via a single word line of a plurality of word lines WL0, WL1, WL2, WL3, WL4, . . . included in the MLC memory block. Similarly, when each of the memory cells included in the TLC memory block is referred to as storing three-bit data, it may indicate that data of three pages can be stored in memory cells coupled via a single word line of a plurality of word lines WL0, WL1, WL2, WL3, WL4, included in the TLC memory block. Similarly, when each of the memory cells included in the QLC memory block is referred to as storing four-bit data, it may indicate that data of four pages can be stored in memory cells coupled via a single word line of a plurality of word lines WL0, WL1, WL2, WL3, WL4, . . . included in the QLC memory block.

In an embodiment, it is exemplified that the memory device 150 is implemented as a nonvolatile memory such as a flash memory, for example, a NAND flash memory, for convenience of description. However, the memory device 150 may be implemented as any of memories such as a phase change random access memory (PCRAM), a resistive random access memory (RRAM or ReRAM), a ferroelectric random access memory (FRAM) and a spin transfer torque magnetic random access memory (STT-RAM or STT-MRAM).

The controller 130 may control overall operations of the memory device 150, such as read, write, program, and erase operations. For example, the controller 130 may control the memory device 150 in response to a request from the host 102. The controller 130 may provide data, read from the memory device 150, to the host 102. The controller 130 may also store data, provided by the host 102, into the memory device 150.

The controller 130 may include a host interface (I/F) 132, a processor 134, an error correction code (ECC) component 138, a power management unit (PMU) 140, a memory interface (I/F) 142, and memory 144, all operatively coupled via an internal bus.

The host interface 132 may process commands and data provided by the host 102, and may communicate with the host 102 through at least one of various interface protocols such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI), and integrated drive electronics (IDE). In accordance with an embodiment, the host interface 132 is a component for exchanging data with the host 102, which may be implemented through firmware called a host interface layer (HIL).

The ECC component 138 can correct error bits of the data to be processed in (e.g., outputted from) the memory device 150, which may include an ECC encoder and an ECC decoder. Here, the ECC encoder can perform error correction encoding of data to be programmed in the memory device 150 to generate encoded data into which a parity bit is added and store the encoded data in memory device 150. The ECC decoder can detect and correct errors contained in a data read from the memory device 150 when the controller 130 reads the data stored in the memory device 150. In other words, after performing error correction decoding on the data read from the memory device 150, the ECC component 138 can determine whether the error correction decoding has succeeded and output an instruction signal (e.g., a correction success signal or a correction fail signal). The ECC component 138 can use the parity bit which is generated during the ECC encoding process, for correcting the error bit of the read data. When the number of the error bits is greater than or equal to a threshold number of correctable error bits, the ECC component 138 might not correct error bits but instead may output an error correction fail signal indicating failure in correcting the error bits.

The ECC component 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC component 138 may include all circuits, modules, systems or devices for performing the error correction operation based on at least one of the above described codes.

The PMU 140 may manage electrical power provided in the controller 130.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134 in a case when the memory device 150 is a flash memory and, in particular, when the memory device 150 is a NAND flash memory. The memory interface 142 can provide an interface for handling commands and data between the controller 130 and the memory device 150, for example, operations of NAND flash interface, in particular, operations between the controller 130 and the memory device 150. In accordance with an embodiment, the memory interface 142 can be implemented through firmware called a Flash Interface Layer (FIL) as a component for exchanging data with the memory device 150.

The memory 144 may support operations performed by the memory system 110 and the controller 130. The memory 144 may store temporary or transactional data which occurs or is delivered for operations in the memory system 110 and the controller 130. The controller 130 may control the memory device 150 in response to a request from the host 102. The controller 130 may deliver data read from the memory device 150 into the host 102. The controller 130 may store data DATA<1:N> entered through the host 102 within the memory device 150. The memory 144 may be used to store data for the controller 130 and the memory device 150, to perform operations such as read operations or program/write operations.

Figure 2:
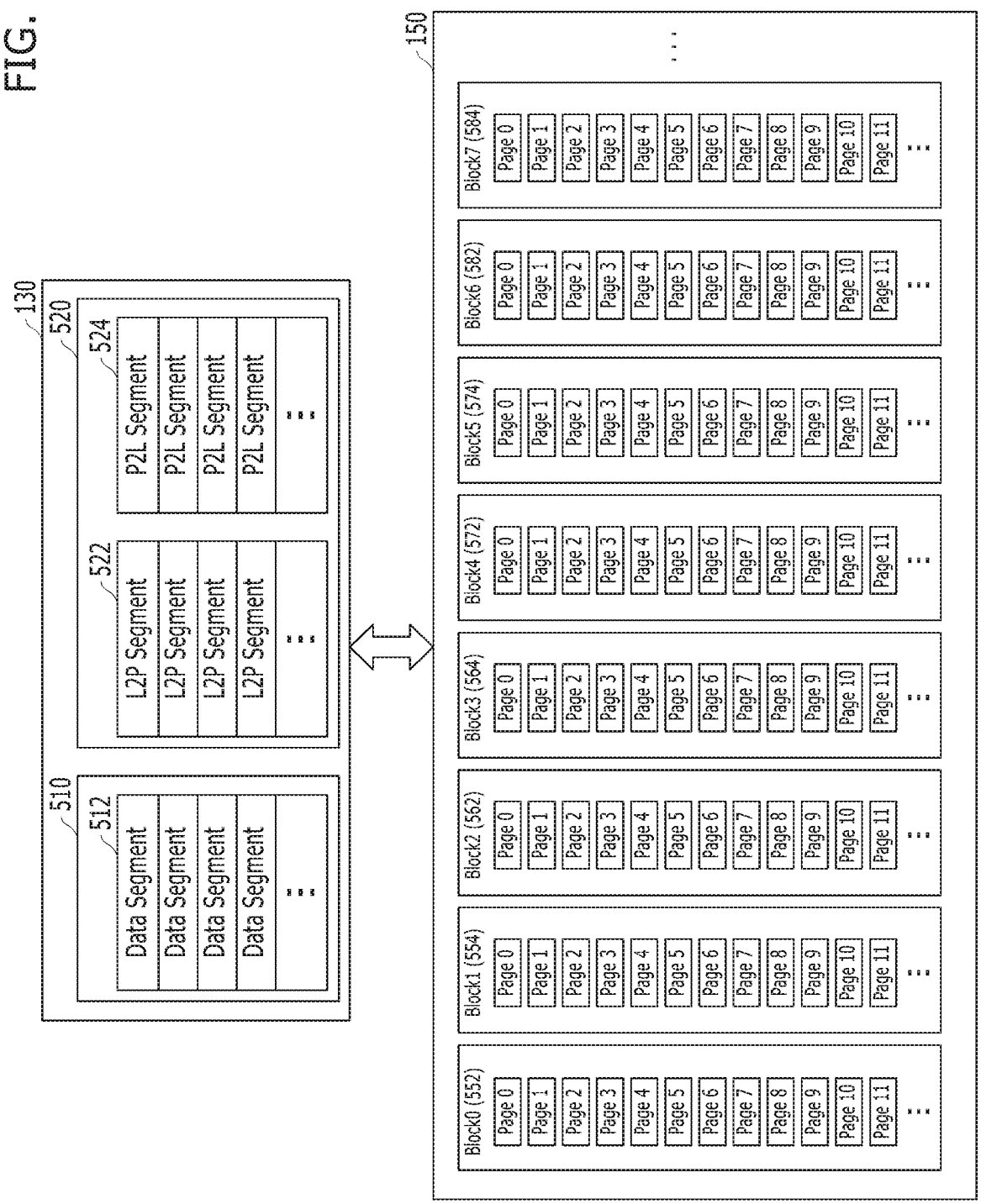
FIG. 2 is a diagram describing an example of a data processing operation which can be performed on a memory device in the memory system in accordance with an embodiment.

The memory 144 may be implemented with a volatile memory. The memory 144 may be implemented with a static random access memory (SRAM), a dynamic random access memory (DRAM), or both. Although FIG. 2 illustrates, for example, the second memory 144 disposed within the controller 130, embodiments are not limited thereto. That is, the memory 144 may be located within or out of the controller 130. For instance, the memory 144 may be embodied by an external volatile memory having a memory interface transferring data and/or signals between the memory 144 and the controller 130.

The memory 144 can store data necessary for performing operations, such as data writing and data reading, requested by the host 102 and/or data transfer between the memory device 150 and the controller 130 for background operations, such as garbage collection and wear levelling as described above. In accordance with an embodiment, for supporting operations in the memory system 110, the memory 144 may include a program memory, a data memory, a write buffer/cache, a read buffer/cache, a data buffer/cache, a map buffer/cache, and the like.

The processor 134 may be implemented with a microprocessor or a central processing unit (CPU). The memory system 110 may include one or more processors 134. The processor 134 may control the overall operations of the memory system 110. By way of example but not limitation, the processor 134 can control a program operation or a read operation of the memory device 150, in response to a write request or a read request entered from the host 102. In accordance with an embodiment, the processor 134 may use or execute firmware to control the overall operations of the memory system 110. Herein, the firmware may be referred to as a flash translation layer (FTL). The FTL may perform an operation as an interface between the host 102 and the memory device 150. The host 102 may transmit requests for write and read operations to the memory device 150 through the FTL.

The FTL may manage operations of address mapping, garbage collection, wear-leveling, and the like. Particularly, the FTL may load, generate, update, or store map data. Therefore, the controller 130 may map a logical address, which is entered from the host 102, with a physical address of the memory device 150 through the map data. The memory device 150 may look like a general storage device to perform a read or write operation because of the address mapping operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the previous particular page to the another newly programed page) due to a characteristic of a flash memory device. Further, the controller 130 may store map data of the new data into the FTL.

For example, when performing an operation requested from the host 102 in the memory device 150, the controller 130 uses the processor 134 implemented in a microprocessor or central processing unit (CPU) or the like. The processor 134 engaged with the memory device 150 can handle instructions or commands corresponding to an inputted command from the host 102. The controller 130 can perform a foreground operation such as a command operation, corresponding to an command inputted from the host 102, for example, a program operation corresponding to a write command, a read operation corresponding to a read command, an erase/discard operation corresponding to an erase/discard command, and a parameter set operation corresponding to a set parameter command or a set feature command with a set command.

For another example, the controller 130 may perform a background operation on the memory device 150 through the processor 134. By way of example but not limitation, the background operation for the memory device 150 includes an operation of copying and storing data stored in a memory block of the memory blocks 152, 154, 156 in the memory device 150 to another memory block, e.g., a garbage collection (GC) operation. The background operation can include an operation of moving or swapping data stored in at least one of the memory blocks 152, 154, 156 into at least another of the memory blocks 152, 154, 156, e.g., a wear leveling (WL) operation and a read reclaim (RR) operation. During a background operation, the controller 130 may use the processor 134 for storing the map data stored in the controller 130 to at least one of the memory blocks 152, 154, 156 in the memory device 150, e.g., a map flush operation. A bad block management operation of checking or searching for bad blocks among the memory blocks 152, 154, 156 is another example of a background operation performed by the processor 134.

In the memory system 110, the controller 130 performs a plurality of command operations corresponding to a plurality of commands entered from the host 102. For example, when performing a plurality of program operations corresponding to a plurality of program commands, a plurality of read operations corresponding to a plurality of read commands, and a plurality of erase operations corresponding to a plurality of erase commands sequentially, randomly, or alternatively, the controller 130 can determine which channel(s) or way(s) among a plurality of channels (or ways) for connecting the controller 130 to a plurality of memory dies included in the memory 150 is/are proper or appropriate for performing each operation. The controller 130 can send or transmit data or instructions via determined channels or ways for performing each operation. The plurality of memory dies included in the memory 150 can transmit an operation result via the same channels or ways, respectively, after each operation is complete. Then, the controller 130 may transmit a response or an acknowledge signal to the host 102. In an embodiment, the controller 130 can check a status of each channel or each way. In response to a command entered from the host 102, the controller 130 may select at least one channel or way based on the status of each channel or each way so that instructions and/or operation results with data may be delivered via selected channel(s) or way(s).

By the way of example but not limitation, the controller 130 can recognize statuses regarding a plurality of channels (or ways) associated with a plurality of memory dies included in the memory device 150. The controller 130 may determine the state of each channel or each way as one of a busy state, a ready state, an active state, an idle state, a normal state, and/or an abnormal state. The controller's determination of which channel or way an instruction (and/or a data) is delivered through can be associated with a physical block address, e.g., which die(s) the instruction (and/or the data) is delivered into. The controller 130 can refer to descriptors delivered from the memory device 150. The descriptors can include a block or page of parameters that describe something about the memory device 150, which is data with a predetermined format or structure. For instance, the descriptors may include device descriptors, configuration descriptors, unit descriptors, and the like. The controller 130 can refer to, or use, the descriptors to determine which channel(s) or way(s) an instruction or a data is exchanged via.

A management unit (not shown) may be included in the processor 134. The management unit may perform bad block management of the memory device 150. The management unit may find bad memory blocks in the memory device 150, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 110. Thus, reliable bad block management may enhance or improve performance of the memory system 110.

The controller 130 may store plural pieces of data DATA<1:N> corresponding to a program command GT_PCMD, NM_PCMD inputted from the host 102 in a buffer/cache included in the memory 144 of the controller 130, and then store the plural pieces of data DATA<1:N> stored in the buffer/cache in the memory blocks 152, 154, 156 included in the memory device 150. That is, when receiving the program command GT_PCMD, or NM_PCMD from the host 102, the controller 130 performs program operations corresponding to the program command GT_PCMD, or NM_PCMD. At this time, the controller 130 may store the plural pieces of data DATA<1:N> corresponding to the program command GT_PCMD, or NM_PCMD in one or more of the memory blocks 152, 154, 156 of the memory device 150, for example, empty memory blocks, open memory blocks or free memory blocks on which an erase operation has been performed. Furthermore, the controller 130 may update map data META_DATA in response to the program operation on the memory device 150, and then store the updated map data META_DATA in the memory blocks 152, 154, 156 included in the memory device 150. That is, the controller 130 may store L2P address information (L2P map) and P2L address information (P2L map) for the plural pieces of data DATA<1:N> stored in the memory blocks as a map table or map list into empty memory blocks, open memory blocks or free memory blocks of the memory blocks of the memory device 150.

Further, in a case where a read command is inputted from the host 102, the controller 130 may read data, corresponding to the read command, from the memory device 150, after checking map data associated with a logical address corresponding to the read command. The controller 130 may store the read data in the buffer/cache included in the memory 144 of the controller 130, and then, output the data stored in the buffer/cache to the host 102.

Moreover, in a case where an erase command is inputted from the host 102, the controller 130 may perform an erase operation including the steps of finding a memory block corresponding to the erase command, erasing data stored in the memory block, updating map data META_DATA corresponding to the erased data and then storing updated map data META_DATA in the memory blocks 152, 154, 156 included in the memory device 150.

Map data may include logical/physical (L2P: logical to physical) information and physical/logical (P2L: physical to logical) information for data stored in memory blocks corresponding to a program operation.

The data corresponding to the command may include the plural pieces of data DATA<1:N> inputted from the host 102 and the meta data META_DATA generated by the controller 130 in response to the storing the plural pieces of data DATA<1:N> in the memory device 150. At this time, the meta data META_DATA may include map data generated by the controller 130 in response to the storing of the data DATA<1:N> in the memory device 150. Furthermore, the meta data META_DATA may include information relevant to the plural pieces of data DATA<1:N> inputted from the host 102, information relevant to a command operation corresponding to the command inputted from the host 102, information relevant to memory blocks of the memory device 150 on which the command operation is performed, and information relevant to map data corresponding to the command operation. In other words, the meta data META_DATA may include all of the relevant data except the plural pieces of data DATA<1:N> inputted from the host 102.

A part of the plurality of memory blocks 152, 154, 156 included in the memory device 150 included in the memory system 110 in accordance with the embodiment may be sorted into an SLC block 152. Another part of the memory blocks 152, 154, 156 may be sorted into MLC blocks. At this time, the MLC blocks may be sorted into TLC blocks 154, 156. The SLC block 152 may indicate the above-described SLC memory block, and the TLC blocks 154, 156 may indicate the above-described TLC memory blocks. FIG. 1A illustrates that the MLC blocks are sorted into TLC blocks. However, the MLC blocks may be sorted into multiple level cell memory blocks depending on a designer's selection.

Referring to FIG. 1A, the controller 130 may store the plural pieces of data DATA<1:N> inputted from the host 102 in the internal volatile memory 144, in response to the first program command GT_PCMD inputted from the host 102. The controller 130 may program the inputted data DATA<1:N> stored in the volatile memory 144 to each of the SLC block 152 and the MLC block 154.

That is, the controller 130 may program plural pieces of inputted data DATA<1:N−1> to the SLC block 152 one by one, until a size of the inputted data DATA<1:N> stored in the volatile memory 144 becomes N pages (PROGRAM DATA<1:N> ONE BY ONE). When the size the plural pieces of inputted data DATA<1:N> stored in the volatile memory 144 reaches N pages, the last piece of inputted data DATA<N> is programmed to the SLC block 152 and the plural pieces of inputted data DATA<1:N> are programmed to the MLC block 154. In the SLC block 152, only one page data may be programmed at once, but in the MLC block 154, N page data may be programmed at once. Furthermore, when a size of the inputted data DATA<1:N> stored in the volatile memory 144 becomes N pages, the controller 130 may program the plural pieces of inputted data DATA<1:N> to the TLC block 154 at once (PROGRAM DATA<1:N> AT ONCE). At this time, the atomicity of the inputted data DATA<1:N> along with the first program command GT_PCMD from the host 102 satisfies a preset level, because the plurality of inputted data DATA<1:N> has been programmed in the SLC block 152 even though a process for programming the plural pieces of inputted data DATA<1:N> to the TLC block 154 may have failed. That is, the plural pieces of inputted data DATA<1:N> corresponding to the first program command GT_PCMD may be in a state indicating that the data should be stored in a nonvolatile state as rapidly as possible through an available resource (performance) supported by the memory system 110.

Referring to FIG. 1B, the controller 130 may store the plural pieces of input data DATA<1:N> along with the second program command NM_PCMD in the internal volatile memory 144. When a size of the input data DATA<1:N> stored in the volatile memory 144 becomes N pages, the controller 130 may program the plural pieces of input data DATA<1:N> to the TLC block 154 at once (PROGRAM DATA<1:N> AT ONCE). However, the controller 130 may not program the plural pieces of input data DATA<1:N> stored in the volatile memory 144 to the SLC block 152. At this time, the atomicity of the input data DATA<1:N> along with the second program command NM_PCMD does not satisfy the preset level. That is, the input data DATA<1:N> corresponding to the second program command NM_PCMD may be in a state indicating that data needs to be stored in a nonvolatile state in the memory system 110 within a predefined time limit.

FIGS. 1A and 1B show that the controller 130 stores the input data DATA<1:N> in a different manner depending on which program command GT_PCMD or NM_PCMD which is inputted with the input data DATA<1:N> from the host 102. That is, the controller 130 may program the data DATA<1:N> inputted with the first program command GT_PCMD in both the SLC block 152 and the TLC block 154, 156. On the other hand, the controller 130 may program the data DATA<1:N> inputted with the second program command NM_PCMD in the TLC block 154, 156, but not the SLC block 152.

For reference, N may be a natural number equal to or greater than 2. In the embodiment, it has been described that the MLC blocks are sorted into the TLC blocks. Therefore, the value of N may be set to '3'. When the MLC blocks are different multiple level cell memory blocks, the value of N may be increased or decreased. The following descriptions will be based on the value of N being 3.

FIG. 1A illustrates that plural pieces of input data DATA<1:3> having a size corresponding to three pages of the SLC block are sequentially inputted to the controller 130, and each piece of data DATA<1>, DATA<2>, DATA<3> may correspond to each page of the SLC block 152 in the memory device 150. Whenever the piece of data DATA<1>, DATA<2>, DATA<3> of the input data DATA<1:3> of three pages is inputted, the controller 130 may store the piece of data in the volatile memory 144. Then, the controller 130 may program the stored data to the SLC block 152. Therefore, the pieces of data DATA<1:3> may be respectively stored in the SLC block 152 through three program operations. After the pieces of data DATA<1:3> are stored in the volatile memory 144, the controller 130 may store the pieces of data DATA<1:3> in the TLC block 154, 156. Therefore, the pieces of data DATA<1:3> may be stored in the TLC block 154, 156 through a single program operation. That is, the pieces of data DATA<1:3> may be redundantly stored in the SLC block 152 and the TLC block 154, 156.

The controller 130 may invalidate the pieces of input data DATA<1:3> which have been programmed in the SLC block 152, after completely programming the pieces of input data DATA<1:3> in the TLC block 154, 156. That is, the controller 130 may invalidate the data DATA<1:3> in the three pages of the SLC block 152, at the time when the operation of programming the data DATA<1:3> in the TLC block 154, 156 is completed. Thus, the data DATA<1:3>, stored in the TLC block 154, 156, may be stored and retained.

For example, when the atomicity regarding a part of data or information transferred from the host 102 or generated by the controller 130, which are programmed to the memory device 150, is required to be equal to or greater than a preset level, the controller 130 may order the memory device 150 to program the corresponding data to the TLC block 154 as well as the SLC block 152. When the corresponding data is completely programmed to the SLC block 152 or the TLC block 154, the controller 130 may transfer a response to the host 102, the response including the atomicity showing that the corresponding data are completely programmed in the memory device 150. Then, when the corresponding data is programmed to the TLC block 154, the controller 130 invalidates (unmaps) the corresponding data stored in the SLC block 152. Such an operation may easily cope with an abnormal situation in which an operation of programming data with high atomicity in the TLC block 154 is lengthened, because the data can be programmed in the SLC block 152 earlier than in the TLC block 154.

When the data DATA<1:N> are programmed to the TLC block 154 at once in an abnormal situation (PROGRAM DATA<1:N> AT ONCE), much unnecessary dummy data may be generated. In such an abnormal situation, data with high atomicity are stored as backup data in the SLC block 152. Therefore, when the memory system 110 escapes from the abnormal situation, the controller 130 may use the backup data stored in the SLC block 152 to recover the data of the TLC block 154. In this case, when the data are programmed to the TLC block 154 through the recovery operation, unnecessary dummy data programmed to the TLC block 154 can be reduced.

The controller 130 may map logical addresses LBA<1:3> inputted with the input data DATA<1:3> from the host 102 to only the physical addresses of the page in the TLC block 154 (LBA<1:3> TO '154' MAPPING), not the physical addresses of the pages in the SLC block 152. That is, the controller 130 may not associate the logical addresses LBA<1:3> with the physical addresses of the pages in the SLC block 152.

When programming the input data DATA<1:3> to the SLC block 152, the controller 130 may further program position information of the pages, where the input data DATA<1:3> are programmed or scheduled to be programmed in the TLC blocks 154, 156 corresponding to the program operation, to spare areas of the pages where the programming is performed. For example, when the controller 130 programs the first data DATA<1> to both a first page of the SLC block 152 and a first page of the first TLC block 154, the first data DATA<1> may be programmed to a data area of the first page of the SLC block 152, and the position information of the first page of the first TLC block 154 may be programmed in a spare area of the first page of the SLC block 152.

The position information of the pages where the input data DATA<1:3> are programmed or scheduled to be programmed in the TLC blocks 154, 156 corresponding to the program operation may indicate the physical address of the page where the input data DATA<1:3> are programmed or scheduled to be programmed in the TLC blocks 154. 156. That is, when programming the input data DATA<1:3> to the SLC block 152, the controller 130 may further program the physical addresses of the pages, where the input data DATA<1:3> are programmed or scheduled to be programmed in the TLC blocks 154, 156 corresponding to the program operation, in the spare areas of the pages where the programming is performed.

The position information of the pages where the input data DATA<1:3> are programmed or scheduled to be programmed in the TLC blocks 154, 156 corresponding to the program operation may include information corresponding to the order in which the input data DATA<1:3> are programmed or scheduled to be programmed in the TLC blocks 154, 156. That is, when programming the input data DATA<1:3> to the SLC block 152, the controller 130 may further program the information, corresponding to the order of the pages where the input data DATA<1:3> are programmed or scheduled to be programmed in the TLC blocks 154, 156, to the spare areas of the pages where the programming is performed.

The position information of the page where the input data DATA<1:3> are programmed or scheduled to be programmed in the TLC blocks 154, 156 corresponding to the program operation may include information corresponding to the time point that the input data DATA<1:3> are programmed or scheduled to be programmed in the TLC blocks 154, 156. That is, when programming the input data DATA<1:3> to the SLC block 152, the controller 130 may further program the information, corresponding to the time point that the input data DATA<1:3> are programmed or scheduled to be programmed in the TLC blocks 154, 156, in the spare areas of the pages where the programming is performed. For example, when the plural pieces of input data DATA<1:3> are stored in the first to third pages of the SLC block 152, position information in the TLC blocks 154, 156 where the plural pieces of input data DATA<1:3> could be programmed into may be stored in the spare areas of the first to third pages in the SLC block 152.

When the memory system 110 is powered on again after an SPO occurred while the redundant program operation was performed on each of the SLC block 152 and the TLC blocks 154, 156, the controller 130 may perform a recovery checking operation of retrieving a programmed page or erased page in the TLC blocks 154, 156 corresponding to the program operation by referring to position information stored in a spare area of a valid page retrieved in the SLC block 152, and checking the state of the programmed page or erased page retrieved in the TLC blocks 154, 156. The controller 130 may selectively perform a recovery operation on the TLC blocks from the SLC block 152, according to the performance result of the recovery checking operation.

FIG. 1B illustrates that the input data DATA<1:3> of the three pages are sequentially inputted to the controller 130 by data DATA<1>, DATA<2>, DATA<3> of one page from the host 102. After all of the data DATA<1:3> corresponding to the three pages of the SLC block 152 are stored in the volatile memory 144, the controller 130 may store the data DATA<1:3> of the page in the TLC blocks 154, 156. Therefore, the data DATA<1:3> may be stored in the TLC blocks 154 and 156 through a single program operation.

Furthermore, the controller 130 may not program the data stored in the volatile memory 144 to the SLC block 152.

Since the data DATA<1:3> inputted from the host 102 are programmed to the TLC blocks 154, 156 and not programmed to the SLC block 152, the controller 130 may associate the logical addresses LBA<1:3> received with the input data DATA<1:3> from the host 102 with only the physical addresses of the pages in the TLC block 154, 156 (LBA<1:3> TO '154' MAPPING).

FIG. 2 is a diagram for describing an example of a data processing operation which can be performed on a memory device in the memory system in accordance with the embodiment.

Referring to FIG. 2, the controller 130 may receive a program command, program data and logical addresses from the host 102. The controller 130 programs and stores the program data in the plurality of pages included in memory blocks 552, 554, 562, 564, 572, 574, 582, 584 of the memory device 150, in response to the program command.

The controller 130 generates and updates metadata for the program data, and programs and stores the metadata in the memory blocks 552, 554, 562, 564, 572, 574, 582, 584 of the memory device 150. The metadata include logical/physical (L2P: logical to physical) information and physical/logical (P2L: physical to logical) information for the program data stored in the memory blocks 552, 554, 562, 564, 572, 574, 582, 584. Also, the metadata may include information regarding command data corresponding to a command inputted from the host 102, information regarding a command operation corresponding to the command, information regarding the memory blocks in the memory device 150 to which the command operation is to be performed, and information regarding map data used for the command operation. In other words, metadata may include all remaining information and data except for program data corresponding to a command inputted from the host 102 and user data stored in the memory device 150.

The logical/physical (L2P: logical to physical) information and the physical/logical (P2L: physical to logical) information may show associations between logical addresses and physical addresses, e.g., information in which the physical addresses are linked to the logical addresses by the controller 130 in response to the program command. The physical addresses may be addresses corresponding to physical storage spaces of the memory device 150 where the program data inputted from the host 102 are to be stored.

The controller 130 may store the mapping information between the logical addresses and the physical addresses, that is, the logical/physical (L2P: logical to physical) information and the physical/logical (P2L: physical to logical) information, in at least one memory block of the memory blocks 552, 554, 562, 564, 572, 574, 582, 584 of the memory device 150. The at least one memory block which stores the logical/physical (L2P: logical to physical) information and the physical/logical (P2L: physical to logical) information may be referred to as a system block.

For example, the controller 130 caches and buffers the program data corresponding to the program command, in a first buffer 510 included in the memory 144 of the controller 130, that is, stores data segments 512 of user data in the first buffer 510 as a data buffer/cache. Thereafter, the controller 130 programs and stores the data segments 512 stored in the first buffer 510, in the pages included in the memory blocks 552, 554, 562, 564, 572, 574, 582, 584 of the memory device 150.

As the data segments 512 of the program data are programmed and stored in the pages included in the memory blocks 552, 554, 562, 564, 572, 574, 582, 584 of the memory device 150, the controller 130 generates L2P segments 522 and P2L segments 524 as metadata, and stores the L2P segments in a second buffer 520 included in the memory 144 of the controller 130. In the second buffer 520 of the memory 144 of the controller 130, the L2P segments 522 and the P2L segments 524 may be stored in the form of a list. Then, the controller 130 may program and store the L2P segments 522 and the P2L segments 524 stored in the second buffer 520, in the pages included in the memory blocks 552, 554, 562, 564, 572, 574, 582, 584 of the memory device 150, through a map flush operation.

Also, the controller 130 may receive a read command and logical addresses from the host 102. The controller 130 may read L2P segments 522 and P2L segments 524 corresponding to the logical addresses from the memory device 150 and load them in the second buffer 520, in response to the read command. Then, the controller 130 checks physical addresses of the memory device 150 corresponding to the logical addresses from the L2P segments 522 and the P2L segments 524 loaded in the second buffer 520, reads data segments 512 of user data from storage positions known through the checking, that is, specific pages of specific memory blocks of the memory blocks 552, 554, 562, 564, 572, 574, 582, 584, stores the data segments 512 in the first buffer 510, and provides the data segments 512 to the host 102.

As described above, each time a read command and logical addresses are received from the host 102, the controller 130 may read L2P segments 522 and P2L segments 524 corresponding to the logical addresses, and load the segments in the second buffer 520. Frequent repetition of the operation of loading L2P segments 522 and P2L segments 524 in this way may cause the performance degradation of the read operation.

As the controller 130 may load a greater amount of L2P segments 522 and P2L segments 524 from the memory device 150 at a time, a single operation of loading L2P segments 522 and P2L segments 524 may deal with the greater number of read commands. Through this, read performance of the memory system 110 may be improved.

Meanwhile, L2P segments may be optimized to search for physical addresses corresponding to specific logical addresses, and, as a result, may be efficient in searching for physical addresses to be mapped to logical addresses inputted from the host 102, in a read operation.

Also, P2L segments 524 may be optimized for a program operation. The controller 130 may need to quickly allocate storage spaces in the memory device 150 for storing program data, when receiving a program command, program data, and logical addresses from the host 102. In this regard, the controller 130 may load in advance a list of available physical addresses in the second buffer 520. Therefore, at a time when the program command, the program data, and the logical addresses are received from the host 102, the controller 130 may quickly search the list of available physical addresses loaded in the second buffer 520, may map physical addresses for the program data, with the logical addresses, and may then store the program data in the storage spaces corresponding to the physical addresses. At this time, P2L segments 524 may be generated and be temporarily stored in the second buffer 520. The P2L segments 524 stored in the second buffer 520 may be stored in the memory device 150 through a map flush operation.

FIGS. 3A to 3D are diagrams for describing a first program operation which is performed in the memory system in accordance with an embodiment.

Figure 3C:
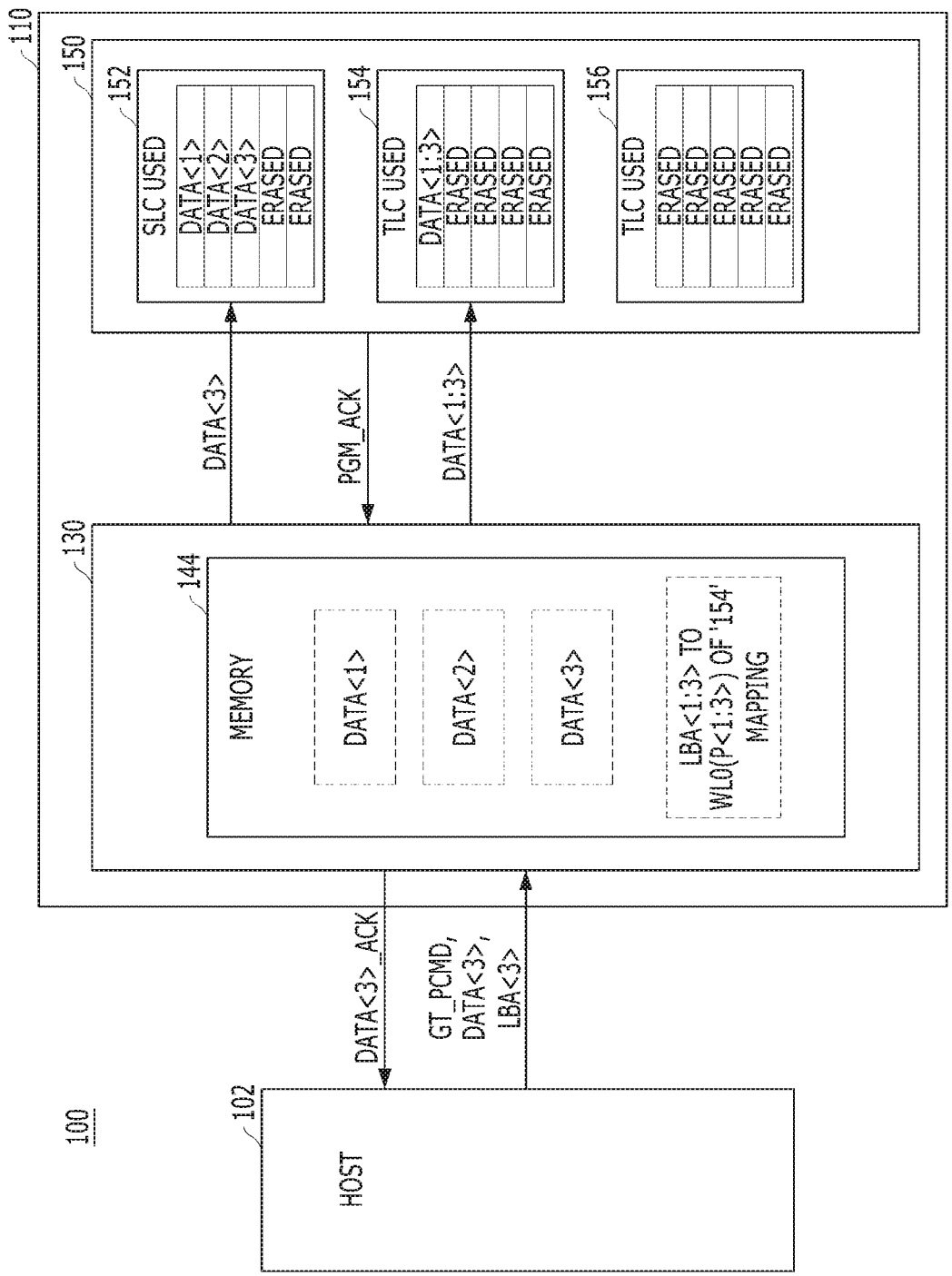
FIG. 3C is a diagram describing a third process of the first program operation which is performed in the memory system in accordance with the embodiment.
Figure 3D:
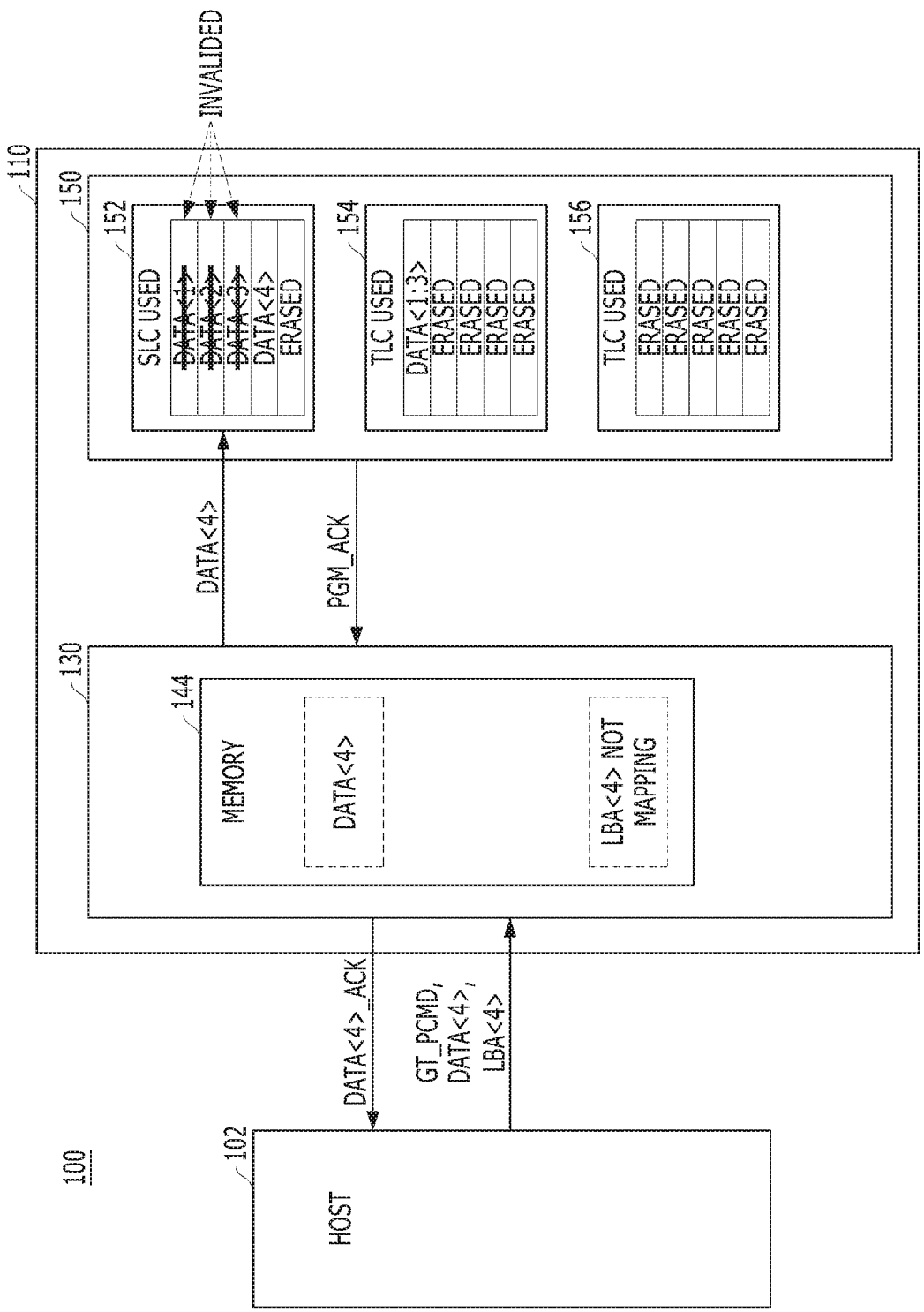
FIG. 3D is a diagram describing a fourth process of the first program operation which is performed in the memory system in accordance with the embodiment.
Figure 3E:
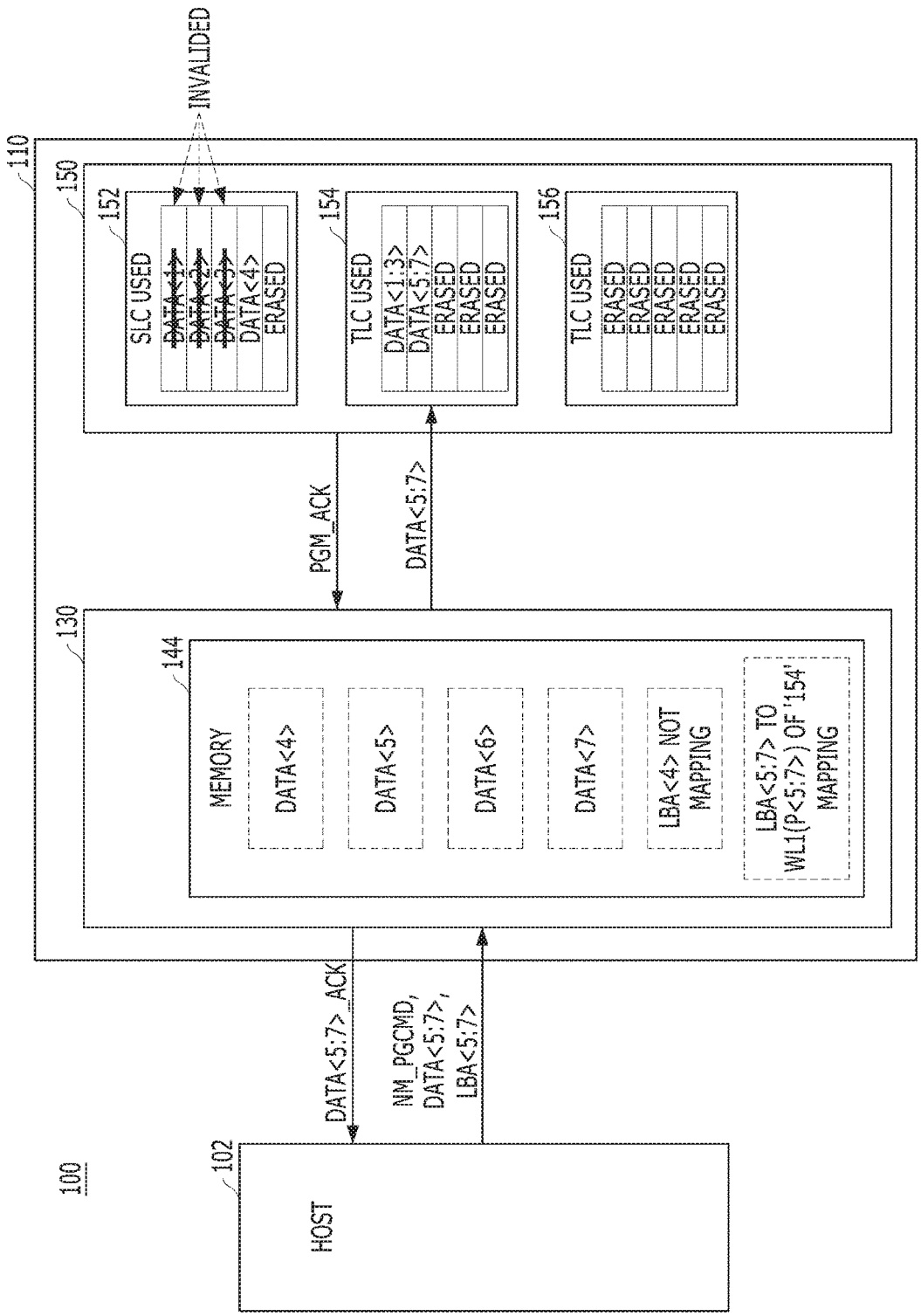
FIG. 3E is a diagram describing the second program operation which is performed in the memory system in accordance with the embodiment.

FIG. 3E is a diagram for describing a second program operation which is performed in the memory system in accordance with an embodiment.

Referring to FIGS. 1A to 3D, a part (memory block 152) of the plurality of memory blocks 152, 154, 156 included in the memory device 150 included in the memory system 110 may be used as the SLC block 152 (SLC USED), and the other memory blocks 154, 156 may be used as the TLC blocks 154, 156 (TLC USED).

Referring to FIGS. 1A to 3A, the host 102 may transmit the first data DATA<1> and the first logical address LBA<1> with the first program command GT_PCMD to the controller 130 of the memory system 110.

The controller 130 may store the first data DATA<1> in the internal volatile memory 144 in response to the first program command GT_PCMD inputted from the host 102. At this time, since only data having a size corresponding to one page of the SLC block, i.e. the first data DATA<1>, is stored in the volatile memory 144, the controller 130 may not program the first data DATA<1> to the TLC blocks 154, 156. In other words, since data having a size corresponding to three pages of the SLC block are not stored in the volatile memory 144, the controller 130 may not perform a program operation on the TLC blocks 154, 156.

On the other hand, since data corresponding to one page, i.e. the first data DATA<1> is stored in the volatile memory 144, the controller 130 may transfer the first data DATA<1> stored in the volatile memory 144 to the memory device 150 to program the first data DATA<1> to the SLC block 152. At this time, the memory device 150 may program the first data DATA<1> transferred from the controller 130 to the first page of the SLC block 152, and then transfer a program acknowledgement signal PGM_ACK to the controller 130, the program acknowledgement signal PGM_ACK indicating that the program operation for the SLC block 152 is completed. The controller 130 may check the program acknowledgement signal PCG_ACK transferred from the memory device 150, and then transfer an acknowledgement signal DATA<1>_ACK to the host 102, the acknowledgement signal DATA<1>_ACK indicating that the first data DATA<1> is completely programmed in the SLC block 152.

The controller 130 may decide whether to map the first logical address LBA<1> to a physical address indicating the first page of the SLC block 152, in which the first data DATA<1> is stored. At this time, as described with reference to FIG. 1A, the controller 130 may not map the physical address of the SLC block 152 to the logical address. Therefore, the controller 130 may not map the first logical address LBA<1> to the physical address indicating the first page of the SLC block 152, in which the first data DATA<1> is stored. As a result, the first logical address LBA<1> may not be mapped to any physical address but stored in the volatile memory 144 (LBA<1> NOT MAPPING).

Referring to FIGS. 1A to 3B, the host 102 may transfer the second data DATA<2> and the second logical address LBA<2> with the first program command GT_PCMD to the controller 130 of the memory system 110, after the operation described with reference to FIG. 3A.

The controller 130 may store the second data DATA<2> in the internal volatile memory 144 in response to the first program command GT_PCMD inputted from the host 102. Therefore, the second data DATA<2> with the first data DATA<1> stored through the above-described operation of FIG. 3A may be stored in the volatile memory 144. At this time, since only data corresponding to two pages, i.e. the first data DATA<1> and the second data DATA<2> are stored in the volatile memory 144, the controller 130 may not program the first data DATA<1> and the second data DATA<2> to the TLC blocks 154, 156. That is, since data corresponding to three pages of the SLC block are not stored in the volatile memory 144, the controller 130 may not perform a program operation on the TLC blocks 154, 156.

On the other hand, since data corresponding to two pages, i.e. the first data DATA<1> and the second data DATA<2> are stored in the volatile memory 144 and the newly stored second data DATA<2> of the data corresponds to one page, the controller 130 may transfer the second data DATA<2> newly stored in the volatile memory 144 to the memory device 150 to program the second data DATA<2> to the SLC block 152. At this time, the memory device 150 may program the second data DATA<2> transferred from the controller 130 to the second page of the SLC block 152, and then transfer the program acknowledgement signal PGM_ACK to the controller 130, the program acknowledgement signal PGM_ACK indicating that the program operation is completed in the SLC block 152.

The controller 130 may check the program acknowledgement signal PGM_ACK transferred from the memory device 150, and then transfer an acknowledgement signal DATA<2>_ACK to the host 102, the acknowledgement signal DATA<2>_ACK indicating that the second data DATA<2> is completely programmed in the SLC block 152.

The controller 130 may decide whether to map the second logical address LBA<2> to a physical address indicating the second page of the SLC block 152, in which the second data DATA<2> is stored. At this time, as described with reference to FIG. 1A, the controller 130 may not map the physical address of the SLC block 152 to the logical address. Therefore, the controller 130 may not map the second logical address LBA<2> to the physical address indicating the second page of the SLC block 152, in which the second data DATA<2> is stored. As a result, the second logical address LBA<2> with the first logical address LBA<1> stored through the above-described operation of FIG. 3A may not be mapped to any physical addresses but stored in the volatile memory 144 (LBA<1:2> NOT MAPPING).

Referring to FIGS. 1A to 3C, the host 102 may transfer the third data DATA<3> and the third logical address LBA<3> with the first program command GT_PCMD to the controller 130 of the memory system 110, after the operation described with reference to FIG. 3B.

The controller 130 may store the third data DATA<3> in the internal volatile memory 144 in response to the first program command GT_PCMD inputted from the host 102. Therefore, the third data DATA<3> with the first and second data DATA<1:2> stored through the above-described operation of FIGS. 3A and 3B may be stored in the volatile memory 144. At this time, since data corresponding to three pages, i.e. the first to third data DATA<1:3> are stored in the volatile memory 144, the controller 130 may transfer the first to third data DATA<1:3> to the memory device 150 to program the first to third data DATA<1:3> to the TLC blocks 154 and 156. At this time, the memory device 150 may program the first to third data DATA<1:3> transferred from the controller 130 to first to third pages of the first TLC block 154 of the TLC blocks 154, 156.

Since data having a size corresponding to three pages of the SLC block, i.e. the first to third data DATA<1:3>, are stored in the volatile memory 144 and the newly stored third data DATA<3> of the data corresponds to one page, the controller 130 may transfer the third data DATA<3> newly stored in the volatile memory 144 to the memory device 150 to program the third data DATA<3> to the SLC block 152.

In this way, the controller 130 may perform the operation of programming the first to third data DATA<1:3> to the first TLC block 154 at once while performing the operation of programming the third data DATA<3> to the SLC block 152.

At this time, when the controller 130 requests the memory device 150 to perform two program operations, the two program operations may be either performed in parallel at the same timing or sequentially performed with a time difference provided therebetween, depending on the state of the memory device 150.

In the drawings, the memory blocks 152, 154, 156 included in the memory device 150 are not divided into a plurality of planes or dies. Therefore, the memory device 150 having the configuration illustrated in the drawings cannot select two memory blocks at the same time to perform program operations in parallel. That is, the memory device 150 having the configuration illustrated in the drawings may sequentially perform the program operations, such that after a program operation for one memory block selected from the plurality of memory blocks 152, 154, 156 is completed, a program operation is performed on the other memory block which is additionally selected. For example, when the SLC block 152 is first selected, the first TLC block 154 may be selected to program the first to third data DATA<1:3> to the first to third pages, after the third data DATA<3> is completely programmed to the third page of the SLC block 152. On the other hand, when the first TLC block 154 is first selected, the SLC block 152 may be selected to program the third data DATA<3> to the third page, after the first to third data DATA<1:3> are completely programmed to the first to third pages of the first TLC block 154. At this time, which memory block is first selected to perform a program operation may be decided differently depending on a designer's selection or the operation environment of the memory device 150 or the controller 130.

On the other hand, when the SLC block 152 and the TLC blocks 154 and 156 included in the memory device 150 are included in different planes or dies unlike the configuration illustrated in the drawings, the controller 130 can perform the operation of programming the first to third data DATA<1:3> to the first TLC block 154 at once and the operation of programming the third data DATA<3> to the SLC block 152 in parallel through an interleaving method. In this case, since two program operations can be performed completely in parallel, which program operation to first complete may be decided differently depending on the designer's selection or the operation environment of the memory device 150 or the controller 130.

As described above, when the program operation is completed in the memory device 150 regardless of whether the two program operations are performed in parallel or sequentially in the memory device 150, that is, when any one of the operation of programming the first to third data DATA<1:3> to the first TLC block 154 at once and the operation of programming the third data DATA<3> to the SLC block 152 is completed, the memory device 150 may transfer the program acknowledgement signal PGM_ACK to the controller 130, the program acknowledgement signal PGM_ACK indicating that the program operation is completed.

At this time, the controller 130 may check the program acknowledgement signal PGM_ACK transferred from the memory device 150, and then transfer an acknowledgement signal DATA<3>_ACK to the host 102, the acknowledgement signal DATA<3>_ACK indicating that the third data DATA<3> is completely programmed. At this time, the program acknowledgement signal PGM_ACK transferred to the controller 130 from the memory device 150 may correspond to the completion of the operation of programming the third data DATA<3> to the SLC block 152 or the operation of programming the first to third data DATA<1:3> to the first TLC block 154. Nevertheless, the reason why the controller 130 transfers, to the host 102, only the acknowledgement signal DATA<3>_ACK indicating that the third data DATA<3> is completely programmed is that the acknowledgement signals DATA<1>_ACK, DATA<2>_ACK indicating that the first and second data DATA<1:2> are completely programmed have been already transferred in FIGS. 3A and 3B. That is, between the host 102 and the controller 130, the fact that the third data DATA<3> is completely programmed and stored in a non-volatile state serves as important information, regardless of whether the third data DATA<3> is completely programmed to the first TLC block 154 with the first and second data DATA<1:2> or whether the third data DATA<3> is completely programmed to the SLC block 152 by itself.

The controller 130 may decide whether to map the third logical address LBA<3> to a physical address indicating the third page of the SLC block 152, in which the third data DATA<3> is stored, in response to the operation of programming the third data DATA<3> to the third page of the SLC block 152. At this time, as described with reference to FIG. 1A, the controller 130 may not map the physical address of the SLC block 152 to the logical address. Therefore, the controller 130 may not map the third logical address LBA<3> to the physical address indicating the third page of the SLC block 152, in which the third data DATA<3> is stored.

The controller 130 may map the first to third logical addresses LBA<1:3> to physical addresses indicating the first to third pages of the first TLC block 154, in which the first to third data DATA<1:3> are stored, in response to the operation of programming the first to third data DATA<1:3> to the first to third pages of the first TLC block 154 (LBA<1:3> TO WL0(P<1:3>) OF '154' MAPPING). That is, the controller 130 may map the first and second logical addresses LBA<1:2>, which have not been mapped to any physical addresses but stored in the volatile memory 144 through the above-described operations of FIGS. 3A and 3B, and the newly inputted third logical address LBA<3> to the physical addresses indicating the first to third pages of the first TLC block 154 in which the first to third data DATA<1:3> are stored (LBA<1:3> TO WL0(P<1:3>) OF '154' MAPPING).

For reference, the reason why the drawings illustrate that the first to third data DATA<1:3> are all stored in a first space of the first TLC block 154 even though the first to third data DATA<1:3> have been programmed to the first to third pages of the first TLC block 154 is that one space in each of the memory blocks 152, 154, 156 corresponds to one word line. That is, in the case of the SLC block 152, one space corresponds to one word line and one page, and in the case of the TLC blocks 154, 156, one space corresponds to one word line and three pages of the SLC block.

Referring to FIGS. 1A to 3D, the three data inputted from the host 102, i.e. the first to third data DATA<1:3>, may be programmed in the SLC block 152 and the first TLC block 154, after the operation described with reference to FIG. 3C. That is, the first to third data DATA<1:3> may be redundantly programmed in the SLC block 152 and the TLC blocks 154, 156. Therefore, in the embodiment, the controller 130 may invalidate the first to third data DATA<1:3> programmed in the SLC block 152 in response to the completion of the operation of programming the first to third data DATA<1:3> to the TLC blocks 154, 156.

After the operation described with reference to FIG. 3C, the host 102 may transfer fourth data DATA<4> and a fourth logical address LBA<4> with the first program command GT_PCMD to the controller 130 of the memory system 110.

The controller 130 may store the fourth data DATA<4> in the internal volatile memory 144 in response to the first program command GT_PCMD inputted from the host 102. At this time, since the third to third data DATA<1:3> do not need to be stored in the volatile memory 144 after the operation described with reference to FIG. 3C, the first to third data DATA<1:3> may be erased in FIG. 3D. Therefore, only data corresponding to one page, i.e. the fourth data DATA<4>, may be stored in the volatile memory 144. Thus, the controller 130 may not program the fourth data DATA<4> to the TLC blocks 154, 156. That is, since data corresponding to three pages are not stored in the volatile memory 144, the controller 130 may not perform a program operation on the TLC blocks 154, 156.

On the other hand, since data corresponding to one page, Le, the fourth data DATA<4>, is stored in the volatile memory 144, the controller 130 may transfer the fourth data DATA<4> stored in the volatile memory 144 to the memory device 150 to program the fourth data DATA<4> to the SLC block 152. At this time, the first to third data DATA<1:3> which have been programmed to the first to third pages of the SLC block 152 after the operation described with reference to FIG. 3C may be invalidated. Therefore, the memory device 150 may program the fourth data DATA<4> transferred from the controller 130 to the fourth page of the SLC block 152, and then transfer the program acknowledgement signal PGM_ACK to the controller 130, the program acknowledgement signal PGM_ACK indicating that the program operation is completed. The controller 130 may check the program acknowledgement signal PGM_ACK transferred from the memory device 150, and then transfer an acknowledgement signal DATA<4>_ACK to the host 102, the acknowledgement signal DATA<4>_ACK indicating that the fourth data DATA<4> is completely programmed.

The controller 130 may decide whether to map the fourth logical address LBA<4> to a physical address indicating the fourth page of the SLC block 152, in which the fourth data DATA<4> is stored. At this time, as described with reference to FIG. 1A, the controller 130 may not map the physical address of the SLC block 152 to the logical address. Therefore, the controller 130 may not map the fourth logical address LBA<4> to the physical address indicating the fourth page of the SLC block 152, in which the fourth data DATA<4> is stored. As a result, the fourth logical address LBA<4> may not be mapped to any physical address but stored in the volatile memory 144 (LBA<4> NOT MAPPING).

FIGS. 3A to 3D show that the host 102 transfers one first program command GT_PCMD to the controller 130 whenever transferring one piece of data DATA<1>, DATA<2>, DATA<3>, DATA<4> to the controller 130 to program the piece of data. However, this is only an embodiment. That is, in an embodiment, the host 102 may transfer one first program command GT_PCMD to the controller 130, and then sequentially transfer the plural pieces of data DATA<1:4> to the controller 130 to program the data.

When the data stored in the SLC block 152 are all invalidated while the above-described operations of FIGS. 3A to 3D are repeated, the controller 130 may erase the SLC block 152 whose all data are invalidated, and reuse the SLC block 152. That is, the data stored in the SLC block 152 may be invalidated at the time that the same data as the data are redundantly programmed to the TLC blocks 154 and 156. Therefore, the data stored in the SLC block 152 may be rapidly invalidated.

Referring to FIGS. 1A to 3E, the host 102 may transfer fifth to seventh data DATA<5:7> and fifth to seventh logical addresses LBA<5:7> with the second program command NM_PCMD to the controller 130 of the memory system 110, after the operation described with reference to FIG. 3D.

The controller 130 may store the fifth to seventh pieces of data DATA<5:7> in the internal volatile memory 144 in response to the second program command NM_PCMD inputted from the host 102. At this time, since data corresponding to three pages, i.e. the fifth to seventh pieces of data DATA<5:7>, are stored in the volatile memory 144, the controller 130 may transfer the fifth to seventh pieces of data DATA<5:7> to the memory device 150 to program the fifth to seventh pieces of data DATA<5:7> to the TLC blocks 154, 156. At this time, the memory device 150 may program the fifth to seventh pieces of data DATA<5:7> transferred from the controller 130 to fourth to sixth pages of the first TLC block 154 between the TLC blocks 154 and 156. For reference, since the fourth piece of data DATA<4> stored in the volatile memory 144 through the above-described operation of FIG. 3D corresponds to the first program command GT_PCMD, the fourth piece of data DATA<4> may be processed differently from the fifth to seventh pieces of data DATA<5:7> corresponding to the second program command NM_PCMD.

Since the fifth to seventh pieces of data DATA<5:7> are data inputted from the host 102 in response to the second program command NM_PCMD, the controller 130 may not program the fifth to seventh pieces of data DATA<5:7> to the SLC block 152. FIG. 3D is based on the supposition that the fifth to seventh pieces of data DATA<5:7> are inputted to the controller 130 from the host 102, for convenience of description. However, since the fifth to seventh pieces of data DATA<5:7> are data inputted from the host 102 in response to the second program command NM_PCMD even when the fifth to seventh pieces of data DATA<5:7> are sequentially inputted with a time difference provided therebetween, the controller 130 may not program the fifth to seventh pieces of data DATA<5:7> to the SLC block 152.

Therefore, the memory device 150 may program the fifth to seventh pieces of data DATA<5:7> transferred from the controller 130 to the fourth to sixth pages of the first TLC block 154, and then transfer the program acknowledgement signal PGM_ACK to the controller 130, the program acknowledgement signal PGM_ACK indicating that the program operation is completed.

Thus, the controller 130 may check the program acknowledgement signal PGM_ACK transferred from the memory device 150, and then transfer an acknowledgement signal DATA<5:7>_ACK to the host 102, the acknowledgement signal DATA<5:7>_ACK indicating that the fifth to seventh pieces of data DATA<5:7> are completely programmed.

The controller 130 may map the fifth to seventh logical addresses LBA<5:7> to physical addresses indicating the fourth to sixth pages of the first TLC block 154, in which the fifth to seventh pieces of data DATA<5:7> are stored, in response to the operation of programming the fifth to seventh pieces of data DATA<5:7> to the fourth to sixth pages of the first TLC block 154 (LBA<5:7> TO WL1(P<5:7>) OF '154' MAPPING).

Figure 4A:
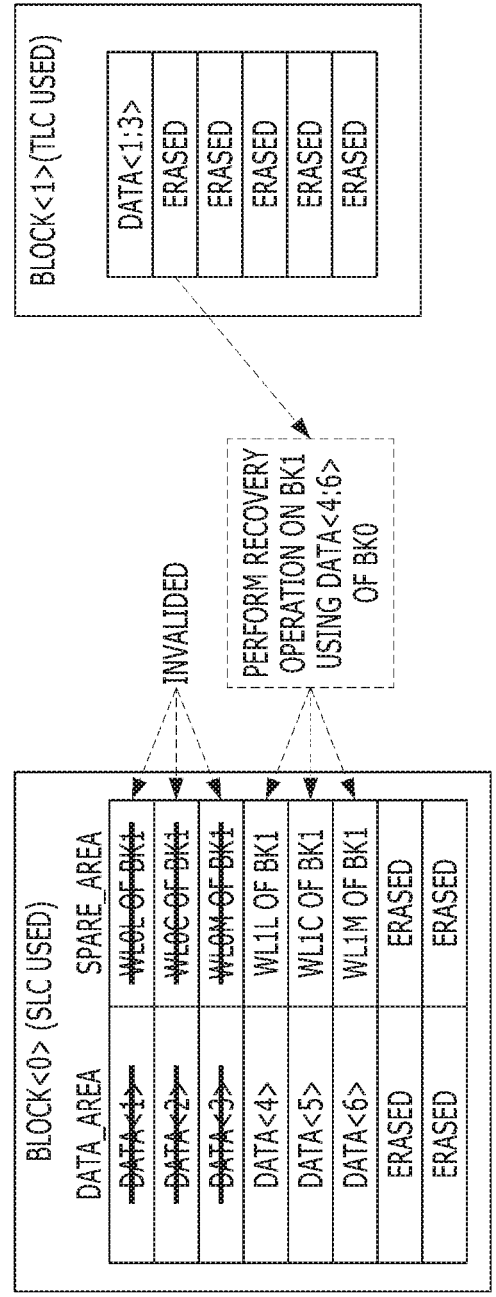
FIG. 4A is a diagram describing a first operation which is performed after a sudden power-off (SPO) occurs during the first program operation in the memory system in accordance with an embodiment.
Figure 4B:
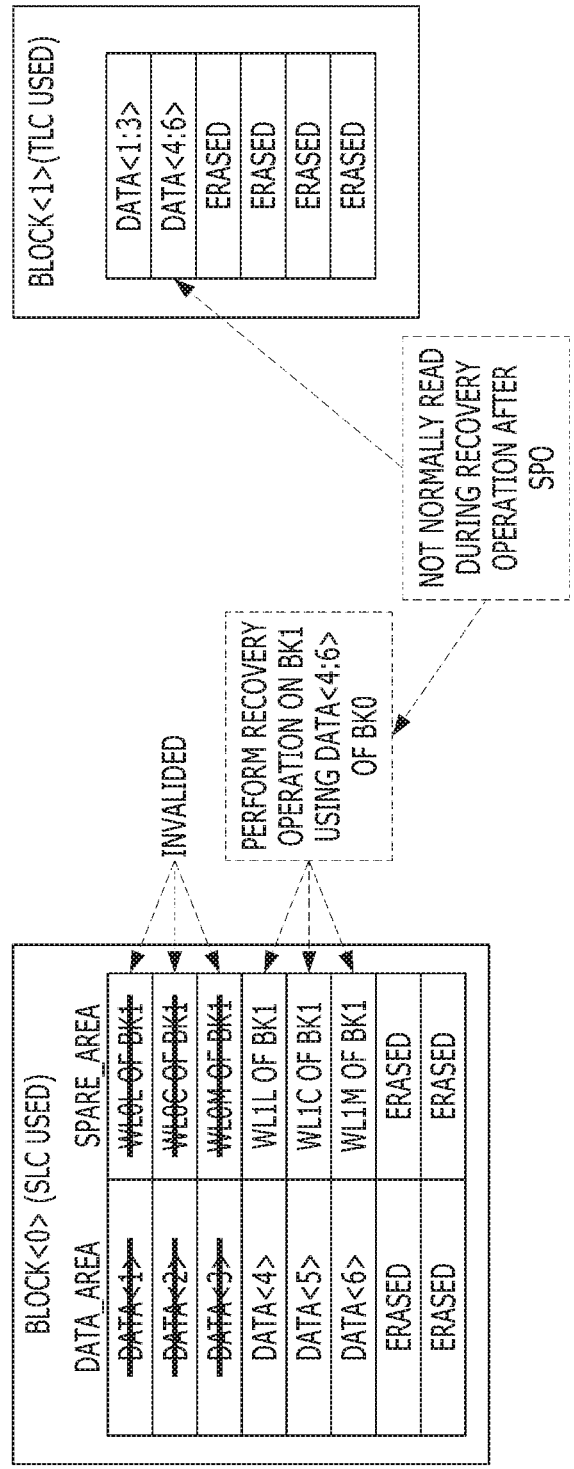
FIG. 4B is a diagram describing a second operation which is performed after an SPO occurs during the first program operation in the memory system in accordance with an embodiment.
Figure 4C:
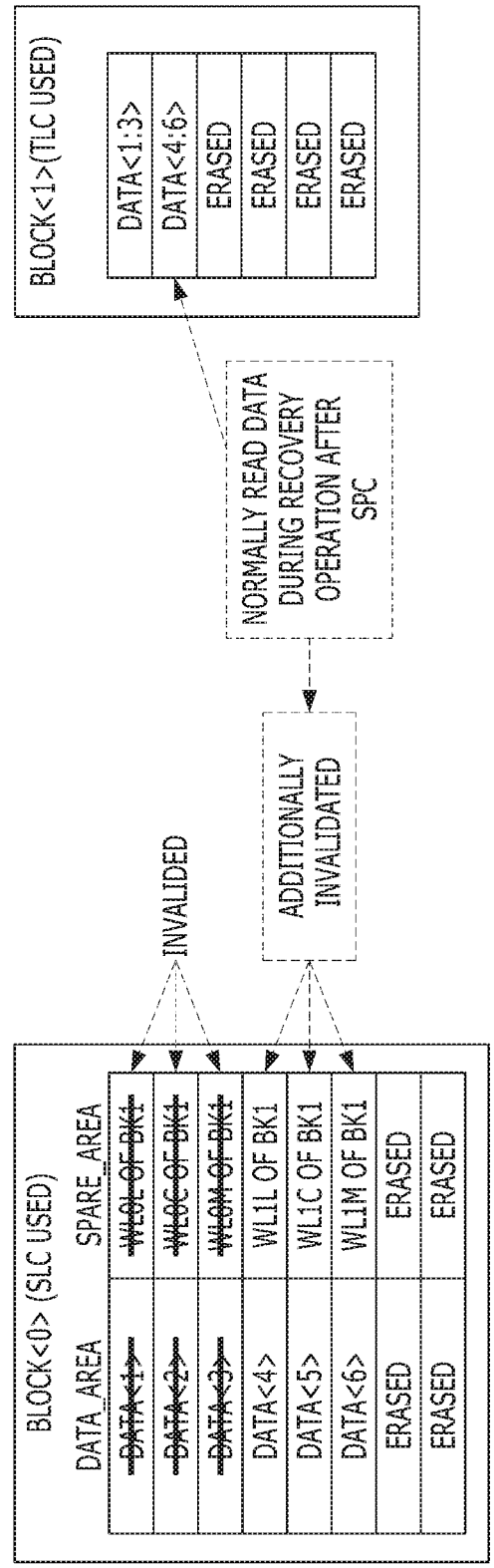
FIG. 4C is a diagram describing a third operation which is performed after an SPO occurs during the first program operation in the memory system in accordance with an embodiment.

FIGS. 4A to 4C are diagrams for describing operations which are performed after an SPO which occurs during the first program operation in the memory system in accordance with the embodiment.

FIGS. 4A to 4C illustrate that first to sixth data DATA<1: 6> are stored in first to sixth pages of a zeroth memory block BLOCK<0> used as an SLC block through the first program operation described with FIGS. 1A to 3D. Similarly, FIGS. 4A to 4C illustrate that the first to sixth data DATA<1:6> are also stored in first to sixth pages of a first memory block BLOCK<1> used as a TLC block (TLC USED). At this time, since the zeroth memory block BLOCK<0> used as an SLC block has the configuration in which one page corresponds to one word line, the first to sixth pieces of data DATA<1:6> may be respectively written to six spaces in the zeroth memory block BLOCK<0> illustrated in such a manner that one space corresponds to one word line. Furthermore, since the first memory block BLOCK<1> used as a TLC block has the configuration in which three pages correspond to one word line, three data each of the first to sixth pieces of data DATA<1:6> may be written to each of two spaces in the first memory block BLOCK<1> illustrated in such a manner that one space corresponds to one word line.

The first to sixth pieces of data DATA<1:6> inputted from the host 102 may be stored in data area DATA_AREA of the six pages included in the zeroth memory block BLOCK<0> used as an SLC block, respectively. Furthermore, position information of pages where the first to sixth pieces of data DATA<1:6> are programmed in the first memory block BLOCK<1> used as a TLC block may be stored in spare areas SPARE_AREA of the six pages included in the zeroth memory block BLOCK<0> used as an SLC block, respectively. For example, the first piece of data DATA<1> may be stored in the data area DATA_AREA of the first page of the SLC block 152, and the position information WL0L OF BK1 of the first page of the first memory block BLOCK<1> may be stored in the spare area SPARE_AREA of the first page of the SLC block 152. Furthermore, the second piece of data DATA<2> may be stored in the data area DATA_AREA of the second page of the SLC block 152, and the position information WL0C OF BK1 of the second page of the first memory block BLOCK<1> may be stored in the spare area SPARE_AREA of the second page of the SLC block 152. Furthermore, the third piece of data DATA<3> may be stored in the data area DATA_AREA of the third page of the SLC block 152, and the position information WL0M OF BK1 of the third page of the first memory block BLOCK<1> may be stored in the spare area SPARE_AREA of the third page of the SLC block 152. Furthermore, the fourth piece of data DATA<4> may be stored in the data area DATA_AREA of the fourth page of the SLC block 152, and the position information WL1L OF BK1 of the fourth page of the first memory block BLOCK<1> may be stored in the spare area SPARE_AREA of the fourth page of the SLC block 152. Furthermore, the fifth piece of data DATA<5> may be stored in the data area DATA_AREA of the fifth page of the SLC block 152, and the position information WL1C OF BK1 of the fifth page of the first memory block BLOCK<1> may be stored in the spare area SPARE_AREA of the fifth page of the SLC block 152. Furthermore, the sixth piece of data DATA<6> may be stored in the data area DATA_AREA of the sixth page of the SLC block 152, and the position information WL1M OF BK1 of the sixth page of the first memory block BLOCK<1> may be stored in the spare area SPARE_AREA of the sixth page of the SLC block 152.

The first page of the first memory block BLOCK<1> may correspond to the least significant bit (LSB) page of the first word line WL0 of the first memory block BLOCK<1>. Therefore, the position information WL0L OF BK1 stored in the spare area SPARE_AREA of the first page of the SLC block 152 may be a physical address indicating the LSB page of the first word line WL0 of the first memory block BLOCK<1>. Similarly, the third page of the first memory block BLOCK<1> may correspond to the most significant bit (MSB) page of the first word line WL0 of the first memory block BLOCK<1>. Therefore, the position information WL0M OF BK1 stored in the spare area SPARE_AREA of the third page of the SLC block 152 may be a physical address indicating the MSB page of the first word line WL0 of the first memory block BLOCK<1>.

The first piece of data DATA<1> may be data which is inputted and programmed for the first time in the first memory block BLOCK<1>. Furthermore, the second piece of data DATA<2> may be data which is inputted and programmed for the second time in the first memory block BLOCK<1>. That is, the first and second pieces of data DATA<1> and DATA<2> may be distinguished from each other in the first memory block BLOCK<1>, based on the order in which the data are programmed. Therefore, the position information WL0L OF BK1 stored in the spare area SPARE_AREA of the first page of the SLC block 152 may be information indicating the data which is inputted and programmed for the first time in the first memory block BLOCK<1>, i.e. the first piece of data DATA<1>. Furthermore, the position information WL0C OF BK1 stored in the spare area SPARE_AREA of the second page of the SLC block 152 may be information indicating data which is inputted and programmed for the second time in the first memory block BLOCK<1>, i.e. the second data DATA<2>.

Based on the time point that the first piece of data DATA<1> is programmed to the first memory block BLOCK<1> and the time point that the second piece of data DATA<2> is programmed to the first memory block BLOCK<1>, the first and second pieces of data DATA<1:2> may be distinguished from each other in the first memory block BLOCK<1>. Therefore, the position information WL0L OF BK1 stored in the spare area SPARE_AREA of the first page of the SLC block 152 may be information indicating the time point that the first piece of data DATA<1> is programmed in the first memory block BLOCK<1>. Furthermore, the position information WL0C OF BK1 stored in the spare area SPARE_AREA of the second page of the SLC block 152 may be information indicating the time point that the second piece of data DATA<2> is programmed in the first memory block BLOCK<1>.

FIG. 4A illustrates the case in which the first to sixth pieces of data DATA<1:6> are normally programmed to the zeroth memory block BLOCK<0> used as an SLC block, but not normally programmed to the first memory block BLOCK<1> used as a TLC block. In FIG. 4A the first to third pieces of data DATA<1:3> inputted before the other data are all normally programmed to the zeroth and first memory blocks BLOCK<0:1>, and the fourth to sixth pieces of data DATA<4:6> inputted after the other data are all normally programmed to the zeroth memory block BLOCK<0>, but not normally programmed to the first memory block BLOCK<1>.

That is, the first to third data DATA<1:3> stored in the zeroth memory block BLOCK<0> have been normally invalidated in response to the completion of the operation of programming the first to third pieces of data DATA<1:3> to the first memory block BLOCK<1>. On the other hand, the fourth to sixth pieces of data DATA<4:6> are not programmed to the first memory block BLOCK<1>, and thus the fourth to sixth pieces of data DATA<4:6> stored in the zeroth memory block BLOCK<0> are not invalidated. That is, all of the fourth to sixth pieces of data DATA<4:6> are normally and completely programmed to the zeroth memory block BLOCK<0>, and an SPO occurs before the operation of programming the fourth to sixth pieces of data DATA<4:6> to the first memory block BLOCK<1> is started.

In this state, when the memory system is powered again on after the SPO occurred, the controller 130 may retrieve valid pages from the zeroth memory block BLOCK<0> used as an SLC block. Furthermore, the controller 130 may retrieve a programmed page or erased page from the first memory block BLOCK<1> which is open and used as a TLC block, by referring to the spare areas of the valid pages in the zeroth memory block BLOCK<0>. The controller 130 may check the state of the programmed page or erased page retrieved from the first memory block BLOCK<1>. According to the state check result, the controller 130 may selectively perform a recovery operation on the first memory block BLOCK<1> from the zeroth memory block BLOCK<0>.

Specifically, when the memory system is powered on again after the SPO occurred, the controller 130 may check that the fourth to sixth pages of the zeroth memory block BLOCK<0> are valid pages, and retrieve the fourth to sixth pages of the first memory block BLOCK<1> by referring to the position information stored in the spare areas SPARE_AREA of the valid pages. The controller 130 may check that the retrieved fourth to sixth pages are erased. Thus, the controller 130 may check that the recovery operation needs to be performed on the fourth to sixth pages of the first memory block BLOCK<1>. Therefore, the controller 130 may perform the recovery operation on the first memory block BLOCK<1> using the fourth to sixth pieces of data DATA<4:6> stored in the valid pages of the zeroth memory block BLOCK<0>, i.e. the fourth to sixth pages. That is, the controller 130 may perform the recovery operation on the first memory block BLOCK<1> by programming the fourth to sixth pieces of data DATA<4:6> read from the valid pages of the zeroth memory block BLOCK<0> to the erased fourth to sixth pages of the first memory block BLOCK<1>.

The controller 130 may invalidate the valid pages of the zeroth memory block BLOCK<0> after completing the recovery operation on the first memory block BLOCK<1> using the valid pages of the zeroth memory block BLOCK<0>.

FIG. 4B illustrates the case in which the first to sixth pieces of data DATA<1:6> are normally programmed to the zeroth memory block BLOCK<0> used as an SLC block, but not normally programmed to the first memory block BLOCK<1> used as a TLC block. In FIG. 4A the first to third pieces of data DATA<1:3> which are programmed to each of the zeroth and first memory blocks BLOCK<0:1> before the other data are all normally programmed, and the fourth to sixth data DATA<4:6> which are programmed to each of the zeroth and first memory blocks BLOCK<0:1> after the other data are normally programmed to the zeroth memory block BLOCK<0>, but not normally programmed to the first memory block BLOCK<1>.

That is, the first to third pieces of data DATA<1:3> stored in the zeroth memory block BLOCK<0> are normally invalidated in response to the completion of the operation of programming the first to third pieces of data DATA<1:3> to the first memory block BLOCK<1>. On the other hand, the fourth to sixth pieces of data DATA<4:6> are not normally and completely programmed to the first memory block BLOCK<1>, and thus the fourth to sixth pieces of data DATA<4:6> stored in the zeroth memory block BLOCK<0> are not invalidated. That is, all of the fourth to sixth pieces of data DATA<4:6> are normally and completely programmed to the zeroth memory block BLOCK<0>, and an SPO occurs during the operation of programming the fourth to sixth pieces of data DATA<4:6> to the first memory block BLOCK<1>.

In this state, when the memory system is powered on again after the SPO occurred, the controller 130 may retrieve valid pages from the zeroth memory block BLOCK<0> used as an SLC block. Furthermore, the controller 130 may retrieve a programmed page or erased page from the first memory block BLOCK<1> which is open and used as a TLC block, by referring to the spare areas of the valid pages in the zeroth memory block BLOCK<0>. The controller 130 may check the state of the programmed page or erased page retrieved from the first memory block BLOCK<1>. According to the state check result, the controller 130 may selectively perform a recovery operation on the first memory block BLOCK<1> from the zeroth memory block BLOCK<0>.

Specifically, when the memory system is powered on again after the SPO occurred, the controller 130 may check that the fourth to sixth pages of the zeroth memory block BLOCK<0> are valid pages, and retrieve the fourth to sixth pages of the first memory block BLOCK<1> by referring to the position information stored in the spare areas SPARE_AREA of the valid pages. The controller 130 may check whether the data stored in the retrieved fourth to sixth pages, i.e. the fourth to sixth data DATA<4:6> can be normally read. As a result, the controller 130 may check that the fourth to sixth pieces of data DATA<4:6> cannot be normally read from the fourth to sixth pages of the first memory block BLOCK<1>. Thus, the controller 130 may check that the recovery operation needs to be performed on the fourth to sixth pages of the first memory block BLOCK<1>. Therefore, the controller 130 may perform the recovery operation on the first memory block BLOCK<1> using the fourth to sixth pieces of data DATA<4:6> stored in the valid pages of the zeroth memory block BLOCK<0>, i.e. the fourth to sixth pages. At this time, the recovery operation on the first memory block BLOCK<1> may be performed in various cases. For example, the controller 130 may perform the recovery operation on the first memory block BLOCK<1> by invalidating the pages from which data cannot be normally read in the first memory block BLOCK<1>, i.e. the fourth to sixth pages, and then selecting other erased pages from the first memory block BLOCK<1> to program the fourth to sixth pieces of data DATA<4:6> read from the valid pages of the zeroth memory block BLOCK<0>.

Then, the controller 130 may invalidate the valid pages of the zeroth memory block BLOCK<0> after completing the recovery operation on the first memory block BLOCK<1> using the valid pages of the zeroth memory block BLOCK<0>.

FIG. 4C illustrates the case in which the first to sixth pieces of data DATA<1:6> are normally programmed to both of the zeroth memory block BLOCK<0> used as an SLC block and the first memory block BLOCK<1> used as a TLC block. However, in FIG. 4C the state of the first to third data DATA<1:3> which are programmed to each of the zeroth and first memory blocks BLOCK<0:1> before the other data and the state of the fourth to sixth pieces of data DATA<4:6> which are programmed to each of the zeroth and first memory blocks BLOCK<0:1> after the other data are different from each other.

That is, the first to third data DATA<1:3> stored in the zeroth memory block BLOCK<0> are normally invalidated in response to the completion of the operation of programming the first to third pieces of data DATA<1:3> to the first memory block BLOCK<1>. On the other hand, the fourth to sixth pieces of data DATA<4:6> stored in the zeroth memory block BLOCK<0> are not normally invalidated in response to the completion of the operation of programming the fourth to sixth pieces of data DATA<4:6> to the first memory block BLOCK<1>. That is, an SPO occurs after the fourth to sixth pieces of data DATA<4:6> are programmed to each of the zeroth and first memory blocks BLOCK<0:1>.

In this state, when the memory system is powered on again after the SPO occurred, the controller 130 may retrieve valid pages from the zeroth memory block BLOCK<0> used as an SLC block. Furthermore, the controller 130 may retrieve a programmed page or erased page from the first memory block BLOCK<1> which is open and used as a TLC block, by referring to the spare areas of the valid pages in the zeroth memory block BLOCK<0>. Furthermore, the controller 130 may check the state of the programmed page or erased page retrieved from the first memory block BLOCK<1>. According to the state check result, the controller 130 may selectively perform a recovery operation on the first memory block BLOCK<1> from the zeroth memory block BLOCK<0>.

Specifically, when the memory system is powered on again after the SPO occurred, the controller 130 may check that the fourth to sixth pages of the zeroth memory block BLOCK<0> are valid pages, and retrieve the fourth to sixth pages of the first memory block BLOCK<1> by referring to the position information stored in the spare areas SPARE_AREA of the valid pages. The controller 130 may check whether the data stored in the retrieved fourth to sixth pages, i.e. the fourth to sixth pieces of data DATA<4:6> can be normally read. As a result, the controller 130 may check that the fourth to sixth pieces of data DATA<4:6> can be normally read from the fourth to sixth pages of the first memory block BLOCK<1>. Thus, the controller 130 may check that the recovery operation does not need to be performed on the fourth to sixth pages of the first memory block BLOCK<1>. Therefore, the controller 130 may additionally invalidate the valid pages of the zeroth memory block BLOCK<0>, i.e. the fourth to sixth pages.

In accordance with the above-described embodiments, when programming data inputted from the host 102 to the MLC area of the memory system 110, the memory system 110 may backup-program the same data to the SLC area to which data can be programmed faster than the MLC area. Therefore, even during the operation of programming data to the MLC area, the memory system 110 can prevent the data from being lost based on the time point that the backup program operation on the SLC area is completed.

Furthermore, even when small-size data are inputted from the host 120, the memory system 110 can program the small-size data to the MLC area by coupling the small-size data to subsequently inputted data, while preventing a loss of the small-size data through the backup program operation for the SLC area, which makes it possible to minimize an operation of adding and programming dummy data to the MLC area in order to avoid a data loss.

Furthermore, the memory system 110 may map a logical address inputted with data from the host 102 to only a physical address of the MLC area, but not map the logical address to a physical address of the SLC area. Furthermore, the memory system 110 may invalidate the data backup-programmed in the SLC area at the time point that the data are completely programmed to the MLC area. Therefore, when the memory system 110 is powered on again after an SPO occurred, the memory system 110 may recover the data of the MLC area using the valid data read from the SLC area. Therefore, it is possible to prevent a data loss even when an SPO occurs.

Furthermore, when the memory device 150 includes the MLC area, the memory system 110 may operate a part of the MLC area as the SLC area, and utilize the SLC area for the backup and recovery operation, thereby reducing unnecessary dummy data which are stored in the memory device 150 during the backup and recovery operation.

In accordance with an embodiment, the memory system and the operating method thereof may have the following effects.

When programming data inputted from the host or computing device to the MLC area within the memory system, the memory system may backup-program the same data to the SLC area to which data can be programmed faster than to the MLC area, thereby preventing the data from being lost during the program operation to the MLC area, based on the point of time that the backup program operation to the SLC area is completed.

Furthermore, even when small-size data are inputted from the host or computing device, the memory system can program the small-size data to the MLC area through a combination of the small-size data and subsequently-inputted data, while a loss of the small-size data is prevented through the backup-program operation to the SLC area. Therefore, the memory system can minimize an operation of adding and programming dummy data to the MLC area in order to prevent a data loss.

Furthermore, the memory system may map a logical address inputted with data from the host or computing device to only a physical address of the MLC area, but not map the logical address to a physical address of the SLC area, and invalidate the data backup-programmed in the SLC area at the point of time that the data are completely programmed to the MLC area. Therefore, when the memory system is powered-on again after an SPO occurs, the memory system may recover data of the MLC area using valid data read from the SLC area. Therefore, even when the SPO occurs, it is possible to prevent a data loss.

Furthermore, when the memory device includes an MLC area, the memory system may operate a part of the MLC area as the SLC area, and utilize the SLC area for a backup and recovery operation, thereby reducing unnecessary dummy data stored in the memory device during the backup and recovery operation.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
   a nonvolatile memory device comprising a plurality of memory blocks, each block having a plurality of pages, each page having a plurality of memory cells, wherein the plurality of memory blocks includes an SLC (Single Level Cell) block and an MLC (Multi-Level Cell) block; and
   a controller suitable for performing a program operation for input data transmitted from a host to both the SLC block and the MLC block in response to a first program command, and invalidating the input data programmed in the SLC block at a time point when the program operation for the MLC block is completed,
wherein when the memory system is powered on after an SPO (Sudden Power-Off) occurred while the program operation was performed on both the SLC block and the MLC block, the controller performs a recovery operation to the MLC block based on valid data programmed in the SLC block.

2. The memory system of claim 1, wherein the controller does not map a logical address received with the input data from the host to a physical address of a page where the input data is programmed in the SLC block, but maps the logical address to only a physical address of a page where the input data is programmed in the MLC block.

3. The memory system of claim 2, wherein when programming the input data to the SLC block, the controller further programs position information of the page, where the input data is programmed or scheduled to be programmed in the MLC block corresponding to the program operation, to a spare area of the page where the program operation is performed.

4. The memory system of claim 3, wherein when the memory system is powered on again after an SPO occurred while the program operation was performed on each of the SLC block and MLC block, the controller retrieves a programmed page or erased page from the MLC block corresponding to the program operation by referring to position information stored in a spare area of a valid page retrieved from the SLC block, performs a recovery checking operation of checking the state of the programmed page or erased page retrieved from the MLC block, and then selectively performs a recovery operation on the MLC block from the SLC block according to the performance result of the recovery checking operation.

5. The memory system of claim 4, wherein when a first programmed page corresponding to the program operation is retrieved from the MLC block by referring to position information stored in a spare area of a first valid page retrieved from the SLC block during the recovery checking operation, the controller checks whether data stored in the first programmed page can be normally read, and invalidates the first valid page without performing the recovery operation on the first programmed page, when the check result indicates that the data can be normally read.

6. The memory system of claim 5, wherein when the check result indicates that the data cannot be normally read, the controller performs a recovery operation on the first programmed page using the data stored in the first valid page, and invalidates the first valid page after completing the recovery operation.

7. The memory system of claim 6, wherein when a first erased page corresponding to the program operation is retrieved from the MLC block by referring to position information stored in a spare area of a second valid page retrieved from the SLC block during the recovery checking operation, the controller performs a recovery operation on the first erased page through data stored in the second valid page, and invalidates the second valid page after completing the recovery operation.

8. The memory system of claim 7, wherein the position information stored in the spare area of the page to which the input data is programmed when the controller programs the input data to the SLC block comprises the physical address of the page where the input data is programmed or scheduled to be programmed in the MLC block corresponding to the program operation or information corresponding to the order or time point that the input data is programmed or scheduled to be programmed in the MLC block corresponding to the program operation.

9. The memory system of claim 1, wherein the controller controls the nonvolatile memory device not to program input data received from the host to the SLC block, but to program the input data only to the MLC block, in response to a second program command.

10. An operating method of a memory system which includes a plurality of memory blocks, each block including a plurality of pages, each page including a plurality of memory cells, wherein the plurality of memory blocks includes an SLC block and an MLC block, the operating method comprising:
performing a program operation for input data transmitted from a host to both the SLC block and the MLC block in response to a first program command;
invalidating the input data programmed in the SLC block at a time point when the program operation for the MLC block is completed; and
performing a recovery operation to the MLC block based on valid data of the SLC block, when the memory system is powered on after an SPO (Sudden Power-Off) occurs in the program operation for the input data.

11. The operating method of claim 10, further comprising not mapping a logical address received with the input data from the host to a physical address of a page where the input data is programmed in the SLC block, but mapping the logical address to only a physical address of a page where the input data is programmed in the MLC block.

12. The operating method of claim 11, wherein the performing the program operation for the input data comprises:
programming the input data to a normal area of a first page of the SLC block; and
programming position information of the page, where the input data is programmed or scheduled to be programmed in the MLC block corresponding to the program operation, to a spare area of the first page.

13. The operating method of claim 12, wherein the performing of the recovery operation comprises:
retrieving a programmed page or erased page from the MLC block corresponding to the program operation by referring to position information stored in a spare area of a valid page retrieved from the SLC block, and checking the state of the programmed page or erased page retrieved from the MLC block, when the memory system is powered on after an SPO occurs in the program operation for the input data; and
selectively performing a recovery operation on the MLC block from the SLC block according to the result of the checking of the state of the programmed page or erased page.

14. The operating method of claim 13, wherein the selectively performing of the recovery operation comprises:
a first check step of checking whether data stored in a first programmed page corresponding to the program operation can be normally read, when the first programmed page is retrieved from the MLC block by referring to position information stored in a spare area of a first valid page retrieved from the SLC block in the checking of the state of the programmed page or erased page; and
an invalidation step of invalidating the first valid page without performing a recovery operation on the first programmed page, when the result of the first check step indicates that the data can be normally read.

15. The operating method of claim 14, wherein the selectively performing of the recovery operation further comprises performing a recovery operation on the first programmed page using the data stored in the first valid page, and invalidating the first valid page after completing the recovery operation, when the result of the first check step indicates that the data cannot be normally read.

16. The operating method of claim 15, wherein the selectively performing of the recovery operation further comprises performing a recovery operation on the first erased page through data stored in a second valid page retrieved from the SLC block in the checking of the state of the programmed page or erased page, and invalidating the second valid page after completing the recovery operation, when a first erased page corresponding to the program operation is retrieved from the MLC block by referring to position information stored in a spare area of the second valid page.

17. The operating method of claim 16, wherein the position information stored in the spare area of the first page comprises the physical address of the page where the input data is programmed or scheduled to be programmed in the MLC block corresponding to the program operation or information corresponding to the order or time point that the input data is programmed or scheduled to be programmed in the MLC block corresponding to the program operation.

18. The operating method of claim 10, further comprising not programming input data received from the host to the SLC block, but programming the input data only to the MLC block, in response to a second program command.

19. A memory system comprising:

a nonvolatile memory device comprising a plurality of memory blocks, each block having a plurality of memory cells, wherein the plurality of memory blocks includes an SLC block and an MLC block; and a controller suitable for instructing the nonvolatile memory device to program first data, whose atomicity satisfies a preset level, to both the SLC block and the MLC block through a program operation, the atomicity indicating that the first data would be programmed to the nonvolatile memory device, wherein the controller outputs, to an outside, a signal indicating that the program operation for the first data is completed, when one of the program operation performed in the SLC block and the program operation performed in the MLC block is completed, invalidates the first data programmed in the SLC block when the program operation performed in the MLC block is completed, and performs a recovery operation to the MLC block using the valid first data in the SLC block, when the memory system is powered on after an SPO occurred while the program operation was performed on both the SLC block and the MLC block.

20. The memory system of claim 19, wherein the controller instructs only the MLC block to perform a program operation on second data whose atomicity does not satisfy the preset level, among the data inputted from the outside, the atomicity indicating that the second data is to be programmed to the nonvolatile memory device.

* * * * *